(12) United States Patent
Mishra et al.

(10) Patent No.: US 11,495,890 B2
(45) Date of Patent: Nov. 8, 2022

(54) POWER AMPLIFIER CONTROL WITH AN ANTENNA ARRAY

(71) Applicant: Qualcomm Incorporated, San Diego, CA (US)

(72) Inventors: Chinmaya Mishra, San Diego, CA (US); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 250 days.

(21) Appl. No.: 16/870,644

(22) Filed: May 8, 2020

(65) Prior Publication Data

US 2021/0351517 A1 Nov. 11, 2021

(51) Int. Cl.
*H01Q 21/00* (2006.01)
*H01Q 1/50* (2006.01)
*H03F 3/24* (2006.01)

(52) U.S. Cl.
CPC .......... *H01Q 21/0006* (2013.01); *H01Q 1/50* (2013.01); *H03F 3/245* (2013.01); *H03F 2200/451* (2013.01)

(58) Field of Classification Search
CPC ...... H01Q 21/0006; H01Q 1/50; H03F 3/245; H03F 2200/451; H04B 1/0458; H04B 1/0483; H04B 1/04
See application file for complete search history.

(56) References Cited

U.S. PATENT DOCUMENTS

| | | | | |
|---|---|---|---|---|
| 9,712,191 B2 * | 7/2017 | Johansson | ............ | H01Q 3/2605 |
| 2018/0331659 A1 * | 11/2018 | Khesbak | ............... | H03F 1/0266 |

FOREIGN PATENT DOCUMENTS

| | | |
|---|---|---|
| EP | 1524766 A1 | 4/2005 |
| EP | 2756549 A1 | 7/2014 |

OTHER PUBLICATIONS

Hasan et al. "Study of CMOS power amplifier design techniques for ka-band applications", Feb. 2019, Indonesian Journal of Electrical Engineering and Computer Science, vol. 13, No. 2, pp. 808-817 (Year: 2019).*
Rami, et al., "Millimeter Wave MOSFET Amplitude Detector", Department of Electrical and Computer Engineering; SiRF 2010; IEEE, 2010, 4 pages.
Zhou, et al., "A Low-Power Ultra-Wideband CMOS True RMS Power Detector", IEEE Transactions on Microwave Theory and Techniques; vol. 56, No. 5, May 2008, 7 pages.
International Search Report and Written Opinion—PCT/US2021/024245—ISA/EPO—dated Jul. 9, 2021 9 pages.

* cited by examiner

*Primary Examiner* — Daniel D Chang
(74) *Attorney, Agent, or Firm* — Colby Nipper/Qualcomm

(57) ABSTRACT

An apparatus is disclosed for controlling a power amplifier that is coupled to an antenna element of an antenna array. In example implementations, an apparatus includes an antenna element of an antenna array and a power amplification system. The power amplification system includes at least one input node, at least one output node coupled to the antenna element, and at least one power amplifier branch coupled between the at least one input node and the at least one output node. The power amplification system also includes at least one feedback node coupled to the at least one output node, at least one control node, and a feedback control loop coupled between the at least one feedback node and the at least one control node.

30 Claims, 11 Drawing Sheets

POWER AMPLIFIER CONTROL WITH AN ANTENNA ARRAY

TECHNICAL FIELD

This disclosure relates generally to wireless communications with electronic devices and, more specifically, to controlling a power amplifier (PA) that is coupled to an antenna array.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats and other sensors or automated controllers, robotics, automotive electronics, devices embedded in other machines like refrigerators and industrial tools, Internet of Things (IoT) devices, and so forth. These various electronic devices provide services relating to productivity, communication, social interaction, security, safety, healthcare, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet, a Wi-Fi network, or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal from the base station via the air medium as part of a downlink communication to enable mobile services. With a smartphone, mobile services can include social media interactions, making phone and video calls, messaging, watching movies, sharing videos, performing searches, acquiring map information or navigational instructions, finding friends, using other location-based services, transferring money, obtaining another service like a car ride, and so forth.

To provide these and other types of services, electronic devices typically use a wireless transceiver to communicate wireless signals in accordance with some wireless standard. Examples of wireless standards include an IEEE 802.11b or 802.11g Wi-Fi standard and a 4th Generation (4G) cellular standard, both of which are used today with smartphones and other connected devices. However, efforts to enable faster wireless networks through the creation of newer wireless standards are ongoing. Next-generation cellular networks and advanced Wi-Fi networks, for example, are expected to offer significantly higher bandwidths, lower latencies, and access to additional electromagnetic (EM) spectrum. Taken together, this means that exciting new wireless services can be provided to users, such as safer self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smartphones and other traditional computing devices will be deployed, which is sometimes called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. To enable next-generation wireless technologies, IoT devices and electronic devices generally will operate in accordance with 5th Generation (5G) cellular standards and newer Wi-Fi standards. Such devices will be communicating with signals that use wider frequency ranges that are located at higher frequencies of the EM spectrum as compared to those devices that operate in accordance with older wireless standards. For example, many newer devices will be expected to operate at millimeter wave (mmWave) frequencies (e.g., frequencies between at least 24 and 300 Gigahertz (GHz)), as well as at frequencies in the single-digit GHz.

To accommodate these commercial expectations and surmount the associated technical hurdles, the physical components that enable wireless communications under these constraints will be expected to operate efficiently at mmWave and other GHz frequencies. One component that facilitates electronic communication is the wireless interface device, which can include a wireless transceiver and a radio-frequency front-end (RFFE). Unfortunately, the wireless interface devices that are designed to operate in accordance with the Wi-Fi and 4G cellular standards of today are not adequate for the faster Wi-Fi and 5G wireless standards that are evolving for tomorrow. This inadequacy is because these evolving standards are expected to accommodate higher frequencies, more-stringent latency demands, and tighter fiscal constraints.

Consequently, to facilitate the adoption of newer cellular and faster Wi-Fi technologies, as well as the widespread deployment of electronic devices that can provide new capabilities and services, wireless interface devices will be deployed that can handle higher frequencies, such as mmWave frequencies. Electrical engineers and other designers of electronic devices are therefore striving to develop new wireless interface devices that will enable the promise of 5G, faster Wi-Fi, and other higher-frequency technologies to become a reality.

SUMMARY

Newer cellular standards, such as 5G, and newer Wi-Fi standards, such as WiGig®, are intended to establish broadband capabilities at higher frequencies. These higher frequencies include those in the gigahertz (GHz) range, such as frequencies with corresponding millimeter-sized wavelengths (e.g., mmWave frequencies between at least 24-300 GHz). To facilitate wireless communications with mmWave frequencies and even frequencies in the single-digit GHz range, electronic devices may use signal beamforming. Signal beamforming entails employing an antenna array to aim a signal beam in a desired direction. Aiming a signal beam from an origin apparatus toward a destination apparatus can decrease an amount of transmit power required to reach the destination apparatus. Further, beamforming enables a signal to be propagated over a greater distance as compared to an omnidirectional transmission, including with transmissions at mmWave frequencies that tend to attenuate more quickly as they travel through the air.

An electronic device uses an antenna array including multiple antenna elements to generate a signal beam. As described below, this can result in both array-level circuitry or control, which relates to the antenna array as whole, and element-level circuitry or control, which relates to individual ones of the antenna elements. A wireless interface device is coupled to the antenna array to control signal transmissions and receptions. The wireless interface device controls the transmission and reception of signals at an array level. For example, the wireless interface device can change a power level produced by a driver amplifier that feeds a signal to each of the multiple antenna elements of the antenna array as part of a transmission operation. This enables an array-level of control that is applied substantially uniformly across radio circuitry components that may operate differently for different antenna elements of the antenna array.

To generate a signal beam, the multiple antenna elements of the antenna array transmit or receive different versions of a wireless signal, such as different delayed or phase-shifted versions of the wireless signal. In some architectures, a respective element-level chain of components is associated with each antenna element of the antenna array to generate a respective wireless signal version. Individual physical components of each element-level component chain may therefore operate under different signal-generation conditions as compared to those physical components of other element-level component chains.

The existence of diverse operational characteristics at the element-level is in conflict with the array-level control functionality provided by the wireless interface device. In other words, existing approaches to controlling the circuitry coupled to an antenna array focus on controlling the circuitry jointly across the multiple antenna elements. This focus overlooks that different antenna elements can experience different operational characteristics. Consequently, the radio circuitry driving the antenna array can be damaged or caused to have a shortened life span, as is explained below.

To address this array-level versus element-level conflict, circuitry and techniques that are described herein implement a measure of element-level control functionality. An element-level control loop can be coupled to each element-level component chain for each antenna element of the antenna array. In operation, the element-level control loop senses an operational characteristic, such as a voltage or current, of an associated element-level component chain. A voltage at an output of a power amplifier, for instance, can be a sensed operational characteristic. Based on the sensed operational characteristic, the element-level control loop can adjust an operational parameter of the associated element-level component chain. Further, a respective operational parameter of each respective element-level component chain can be adjusted independently of other element-level component chains.

Thus, the circuitry of each individual element-level component chain can be protected based on the operational characteristics that the individual element-level component chain is experiencing. Further, the element-level control loop can be employed along with an array-level controller. In some cases, a respective power amplification system is coupled to a respective antenna element of the antenna array and includes a power amplifier and a feedback control loop. The feedback control loop controls a control voltage of the power amplifier based on a voltage level sensed by a peak detector. The feedback control loop can therefore protect one or more circuit device of the element-level component chain. Further, an array-level gain controller can control a gain for the antenna array as a whole while each feedback control loop controls the control voltage of the power amplifier. This establishes an example of a bi-level control scheme that is enabled by the implementations that are described herein.

In these manners, array-level control schemes that efficiently control array-level circuitry can operate in tandem with element-level control schemes that safely control element-level circuitry. The various element-level circuitry, which can each experience different operational characteristics, can be independently controlled to protect the circuitry from damage and extend its operational life. Additionally, described implementations for element-level control can be grafted onto array-level control functionality without adversely impacting the array-level control.

In an example aspect, an apparatus for controlling a power amplifier that is coupled to an antenna array is disclosed. The apparatus includes an antenna element of the antenna array and a power amplification system. The power amplification system includes at least one input node, at least one output node coupled to the antenna element, and at least one power amplifier branch coupled between the at least one input node and the at least one output node. The power amplification system also includes at least one feedback node coupled to the at least one output node, at least one control node, and a feedback control loop coupled between the at least one feedback node and the at least one control node.

In an example aspect, an apparatus for power amplifier control is disclosed. The apparatus includes an antenna element of an antenna array and a power amplification system. The power amplification system includes at least one input node, at least one output node coupled to the antenna element, and amplification means for amplifying a signal propagating between the at least one input node and the at least one output node. The power amplification system also includes at least one feedback node, at least one control node configured to provide a control voltage to the amplification means, and feedback means for controlling a voltage level present at the at least one feedback node using the at least one control node.

In an example aspect, a method for controlling a power amplifier that is coupled to an antenna array is disclosed. The method includes providing an input signal to a power amplifier branch and amplifying, by the power amplifier branch, the input signal to produce an output signal. The method also includes obtaining a feedback signal from the power amplifier branch and producing a control signal based on the feedback signal and a threshold value. The method additionally includes adjusting a control voltage of the power amplifier branch based on the control signal. The method further includes coupling the output signal to an antenna element of the antenna array.

In an example aspect, an apparatus for controlling a power amplifier that is coupled to an antenna array is disclosed. The apparatus includes a first bias voltage node, a second bias voltage node, a plus input node, a minus input node, a plus output node, and a minus output node. The apparatus also includes a first plus transistor, a first minus transistor, a second plus transistor, and a second minus transistor. The first plus transistor includes a source terminal, a drain terminal, and a gate terminal. The source terminal of the first plus transistor is coupled to a ground node, and the gate terminal is coupled to the plus input node and the first bias voltage node. The first minus transistor includes a source terminal, a drain terminal, and a gate terminal. The source terminal of the first minus transistor is coupled to the ground node, and the gate terminal is coupled to the minus input node and the first bias voltage node. The second plus transistor includes a source terminal, a drain terminal, and a gate terminal. The source terminal of the second plus transistor is coupled to the drain terminal of the first plus transistor, the drain terminal is coupled to the plus output node, and the gate terminal is coupled to the second bias voltage node. The second minus transistor includes a source terminal, a drain terminal, and a gate terminal. The source terminal of the second minus transistor is coupled to the drain terminal of the first minus transistor, the drain terminal is coupled to the minus output node, and the gate terminal is coupled to the second bias voltage node. The apparatus further includes a power amplifier controller. The power amplifier controller is coupled to at least one of the first bias voltage node or the second bias voltage node. The power amplifier controller includes a plus peak detector and a minus peak detector. The plus peak detector is coupled to the drain terminal of the second plus transistor and configured to detect a plus peak value. The minus peak detector is coupled to the drain terminal of the second minus transistor and configured to detect a minus peak value. The power amplifier controller is configured to adjust a control voltage applied to at least one of the first bias voltage node or the second bias voltage node based on the plus peak value and the minus peak value.

BRIEF DESCRIPTION OF DRAWINGS

FIG. 4-1 illustrates an example array-level architecture including an antenna array coupled to multiple element-level component chains and an example array-level feedback control loop.

FIG. 4-2 illustrates another example array-level architecture including an antenna array coupled to multiple element-level component chains and an example array-level gain controller coupled to a driver amplifier.

DETAILED DESCRIPTION

Figure 1:
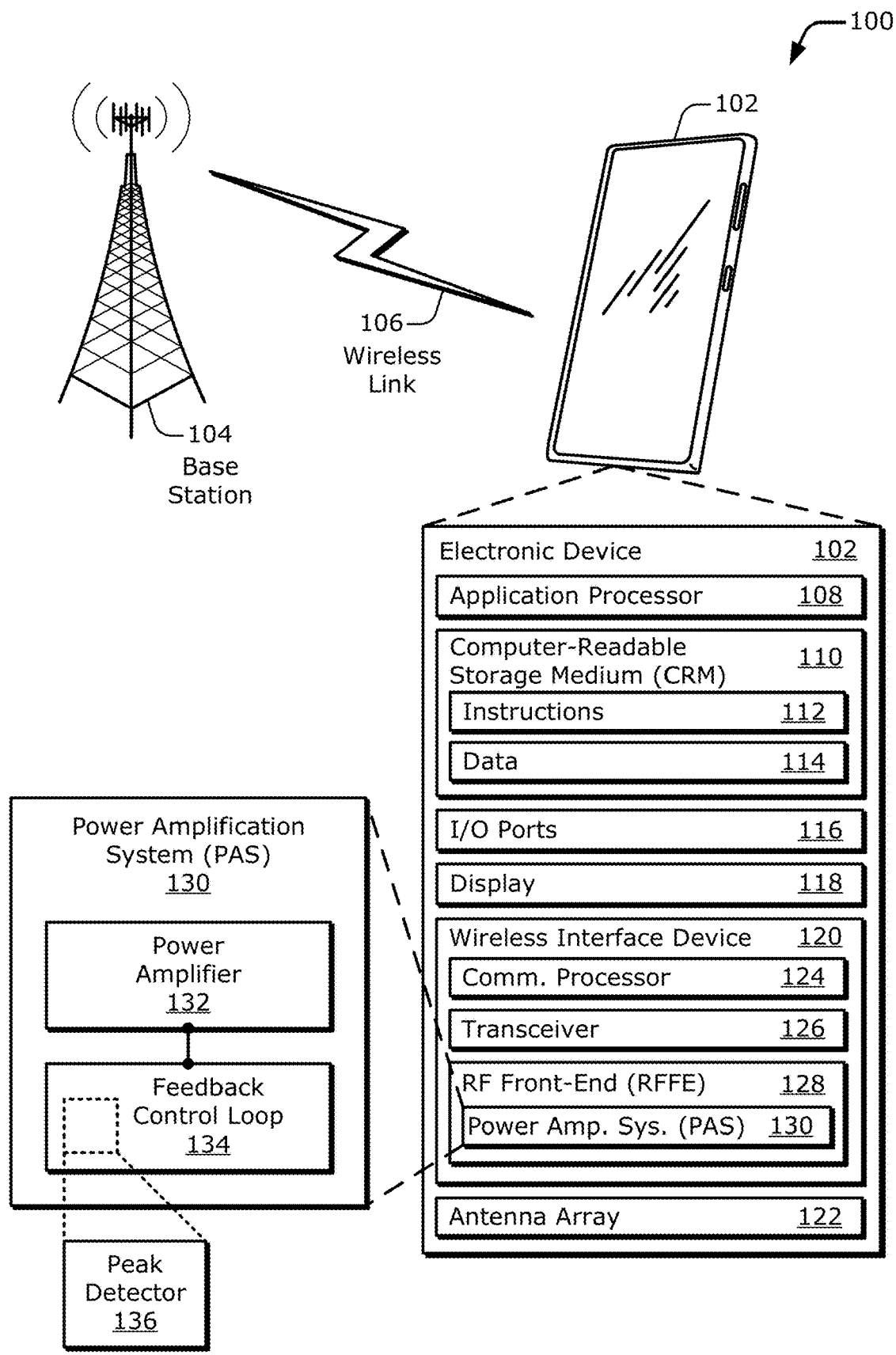
FIG. 1 illustrates an example environment that includes an electronic device having a wireless interface device with a radio-frequency (RF) front-end, which includes at least one power amplification system (PAS) with a feedback control loop.

As compared to 4G cellular and existing Wi-Fi networks, next-generation networks utilize higher electromagnetic (EM) frequencies. These higher EM frequencies include millimeter wave (mmWave) frequencies that can span approximately 24 to 300 Gigahertz (GHz) of the EM spectrum. Examples of next-generation networks include 5G cellular networks and Wi-Gig® Wi-Fi networks. Other technologies that can operate at mmWave frequencies include 5G New Radio Spectrum Sharing (5G NR-SS) and WirelessHD®.

Although higher frequencies can offer higher bandwidth and lower latency, higher frequencies also cause technical difficulties. For example, signals transmitted at higher frequencies are attenuated by the atmosphere more quickly and therefore have shorter intrinsic ranges at a given power level. To account for the naturally-shorter propagation distances, signals can be transmitted via signal beams that direct a signal toward a particular target with more effective power, which is called antenna beamforming or signal beamforming Using antenna beamforming, a transmission at a given power level can travel farther as a signal beam as compared to a signal being transmitted omnidirectionally.

Thus, electronic devices operating in accordance with 5G cellular and mmWave Wi-Fi, for example, may utilize antenna beamforming to direct signals toward receiving devices. A wireless interface device of an electronic device is at least partially responsible for generating signal beams for beamformed communications. To form a transmission signal beam, a wireless interface device uses an antenna array to emanate multiple versions of a transmission signal in which each of the versions is modified with respect to other versions. Signal modifications to produce the different signal versions can include being amplified by different amounts or being phase-shifted with respect to each other (e.g., delayed relative to one another by different time durations).

These signal modifications cause the signal versions to constructively and destructively combine during signal propagation. Areas of constructive EM signal combination produce a signal beam that can be received at relatively farther distances as compared to a signal emanated without using antenna beamforming Receiving a communication signal with beamforming techniques works in a reverse manner by processing different received signal versions to reconstruct a received signal beam along a target direction. Although antenna beamforming is described herein partially in terms of mmWave signaling, beamforming and described power amplifier control implementations are applicable to other EM frequencies.

In antenna beamforming generally, each signal version is provided to or accepted from a respective antenna element of an antenna array of an electronic device. To modify different signal versions corresponding to respective ones of different antenna elements of the antenna array, a wireless interface device that is coupled to the antenna array may include a respective element-level component chain of multiple element-level component chains for each respective antenna element of multiple antenna elements. The electronic device may also include multiple antenna arrays that each have multiple antenna elements to aim signal beams from different sides of the electronic device.

For a given antenna array with multiple antenna elements, the wireless signal device may include array-level control circuitry. The array-level control circuitry obtains an operational characteristic that is related to at least one antenna element of the multiple antenna elements. The array-level control circuitry jointly controls at least one operational parameter across the multiple antenna elements of the antenna array. For instance, if the array-level control circuitry changes an operational parameter, each of the antenna elements—or the radio circuitry coupled thereto—is affected.

In contrast, element-level control circuitry controls at least one operational parameter of an associated element-level component chain that is coupled to an individual antenna element of the antenna array. The element-level control circuitry can adjust an element-level operational parameter based on a sensed operational characteristic that is related to the associated element-level component chain. Generally, adjusting an element-level operational parameter in one element-level component chain does not significantly affect other element-level components chains, even those of the same antenna array.

Consider an example in which each element-level component chain includes a respective power amplifier that is coupled to a respective antenna element of multiple antenna elements of an antenna array. The power amplifier can include multiple transistor devices, such as four transistors for a differential amplifier in cascode configuration. At least the cascode transistor devices can experience breakdown or accelerated aging due to a high voltage standing wave ratio (VSWR) condition that occurs during operation. Some voltages that exceed specified maximum voltage levels can be partially controlled using array-level control techniques.

For example, a power coupler can electromagnetically couple to a signal that is proximate to an antenna element and provide the coupled signal to a power detector. The power detector determines a respective power level for the respective antenna element that is coupled to a respective element-level component chain. An array-level controller accepts the respective power level for each respective element-level component chain and adjusts an array-level operational parameter. For example, the array-level controller can adjust a gain of a driver amplifier that provides a signal to each of multiple element-level component chains to realize a radio-frequency gain index (RGI) controller. The RGI controller can attempt to balance a power level that is requested to reach a destination with a maximum allowable power level for power amplifier circuitry of each element-level component chain. In this manner, the array-level controller can provide a measure of protection and efficiency to the multiple power amplifiers using an array-level component, such as the driver amplifier.

In operation, each element-level component chain does not experience the same operational characteristics. For example, different scan angles for different beamsteering directions impact the various power amplifiers in divergent ways. In some cases, different power amplifiers that are coupled to a single antenna array can experience different voltage levels due to beamsteering. There is a finite electromagnetic coupling between different antenna elements of an antenna array, and this coupling causes a portion of the signaling to be reflected back to the circuitry of the element-level component chains. With regard to the power amplifiers of these chains, the drains of field-effect transistors (FETs) can experience unpredictable or unknown constructive and destructive signal combining due to the reflections from other antenna elements. These multiple signals may constructively combine to generate voltage levels at the FET drains that are sufficiently high to damage the FET devices.

Additionally, a power amplifier of an element-level component chain may be coupled to an antenna element via a transformer. The transformer can serve as a balun to convert between differential signaling at the power amplifier and single-ended signaling a the antenna element, can electrically isolate the antenna element, and so forth. The transformer, however, can also function as a filter to attenuate signals at certain frequencies, especially the higher frequencies of signal harmonics. Due to such a coupling transformer, a voltage level at the antenna element may not track a voltage level at an FET drain of the power amplifier. In other words, an amplitude of a voltage at the drain of the FET may be masked by one or more components coupled between the drain and the antenna element, which is where the power coupler is likely positioned. Because the transformer filters out the higher order harmonics produced by the power amplifier, the divergence of a voltage level at the antenna element versus a voltage level at the power amplifier is greater as frequencies increase.

To address these issues, an element-level control scheme may be implemented. The element-level control scheme can be used for each element-level component chain. An array-level control scheme can also be used in conjunction with the element-level control scheme to realize a bi-level control scheme. Each element-level controller can substantially independently control operation of a corresponding element-level component chain. This independent control can accommodate element-level differences of the operational characteristics experienced by the multiple element-level component chains. For example, an element-level controller can control a voltage level at a drain of an FET of a power amplifier to protect the FET.

In example implementations, an element-level component chain is coupled to an antenna element and includes a power amplification system. The power amplification system includes a power amplifier and a feedback control loop. The power amplifier includes at least one transistor, and the feedback control loop includes at least one peak detector. A transformer is coupled between the transistor and the antenna element. The feedback control loop functions as an element-level feedback control loop. To sense a voltage level that the power amplifier is experiencing, the element-level feedback control loop can tap into the element-level component chain between an output of the power amplifier and an input of the transformer. The peak detector detects the voltage level at the tap point. In this manner, the feedback control loop can "bypass" the filtering effects of the transformer on harmonic frequencies and more accurately sense the voltage at the output of the power amplifier.

In operation, the peak detector of the element-level feedback control loop can therefore detect a peak voltage experienced at the output of the power amplifier. The feedback control loop compares the detected peak voltage to a threshold voltage. If the detected peak voltage fails to comport with the threshold voltage (e.g., exceeds the threshold voltage), feedback logic generates a control signal to adjust a control voltage of the power amplifier. Examples for the control voltage include a bias voltage for at least one transistor of the power amplifier and a supply voltage for the power amplifier. The element-level feedback control loop can thus reduce a peak voltage experienced at the output of the power amplifier to protect the transistor devices of the power amplifier.

This element-level control scheme can also be applied substantially independently for each element-level component chain of each antenna element of the antenna array. Meanwhile, an array-level control scheme can continue to operate at the array level to provide at least some control for the antenna array as a whole. In these manners, element-level protection of circuit devices can be implemented while array-level control functions, such as controlling transmit power through an RGI scheme, are permitted to continue without appreciable modification to accommodate the element-level feedback control.

FIG. 1 illustrates an example environment 100 that includes an electronic device 102 having a wireless interface device 120 with a radio-frequency (RF) front-end 128, which includes at least one power amplification system (PAS) 130. The power amplification system 130 includes at least one power amplifier 132 and at least one feedback control loop 134. In the environment 100, the example electronic device 102 communicates with a base station 104 through a wireless link 106. In FIG. 1, the electronic device 102 is depicted as a smailphone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) standard, such as a Long-Term Evolution (LTE), a 4th Generation (4G), or a 5th Generation (5G) cellular standard; an IEEE 802.11 standard, such as an 802.11g, ac, ax, ad, aj, or ay standard, including Wi-Fi 6; an IEEE 802.16 standard (e.g., WiMAX™); a Bluetooth™ standard; and so forth. In some implementations, the wireless link 106 may wirelessly provide power, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a display screen or a projection that presents one or more graphical images generated by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna array 122. The wireless interface device 120 provides connectivity to respective networks and peer devices via a wireless link, which may be configured similar to or differently from the wireless link 106. Alternatively or additionally, the electronic device 102 may include a wired interface device (not shown), such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. However, the electronic device 102 may also or instead communicate directly with other peer devices, an alternative wireless network, and the like.

As shown, the wireless interface device 120 includes at least one communication processor 124, at least one transceiver 126, and at least one RF front-end 128 (RFFE 128). These components process data information, control information, and signals associated with communicating information for the electronic device 102 via the antenna array 122. The communication processor 124 may be implemented as at least part of a system-on-chip (SoC), a modem baseband processor, or a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques, such as antenna beamforming.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the other components of the electronic device 102. Thus, an operative coupling can enable components to perform a function together or to operate as described herein. The communication processor 124 may also include a memory (not separately shown), such as a CRM 110, to store data and processor-executable instructions (e.g., code).

The various components illustrated in FIG. 1 using separate schematic blocks may be manufactured or packaged in different discrete manners. For example, one physical module may include components of the RF front-end 128 and a portion of the components of the transceiver 126, and another physical module may combine the communication processor 124 with the remaining components of the transceiver 126. Additionally, at least one antenna array 122 may be co-packaged with at least some components of an RF front-end 128 as an antenna module. Further, an electronic device 102 may include multiple such antenna modules, thereby spatially distributing various physical components of at least one RF front-end 128 within a housing of the electronic device 102.

The transceiver 126 can include circuitry and logic for filtering, amplification, channelization, and frequency translation. The frequency translation may include an up-conversion or a down-conversion of frequency that is performed in a single conversion operation (e.g., a direct-conversion architecture) or through multiple conversion operations (e.g., a superheterodyne architecture). The transceiver 126 can include filters, switches, amplifiers, mixers, and so forth for routing and conditioning signals that are transmitted or received via the antenna array 122. Although not explicitly shown, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them.

The components or circuitry of the transceiver 126 can be implemented in any suitable fashion, such as combined transceiver logic or separately as respective transmitter and receiver entities. In some cases, the transceiver 126 is implemented with multiple or different sections to implement respective transmitting and receiving operations (e.g., separate transmit and receive chains, respectively). The transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna array 122 or for conditioning signals to be transmitted via the antenna array 122. As shown, the RF front-end 128 includes at least one power amplification system 130 (PAS 130). The RF front-end 128 may also include other RF sensors and components, such as a peak detector 136, a power meter, a gain control block, an antenna tuning circuit, an N-plexer, a balun, and the like. Configurable components of the RF front-end 128, such as the power amplification system 130, may be controlled by the communication processor 124 to implement communications in various modes, with different frequency bands, or using antenna beamforming Although the power amplification system 130 is depicted as being part of an RF front-end 128, described implementations of a power amplification system 130 can alternatively be employed in other portions of the wireless interface device 120 or in other portions of the electronic device 102 generally.

In example implementations, the power amplification system 130 includes at least one power amplifier 132 and at least one feedback control loop 134, which includes at least one peak detector 136. The power amplifier 132 amplifies, or increases an amplitude of, a signal that is to be transmitted via the antenna array 122. As described herein, the peak detector 136 senses at least one operational characteristic, such as a voltage level of the power amplifier 132. The feedback control loop 134 adjusts at least one operational parameter, such as a bias or supply voltage of the power amplifier 132, based on the sensed operational characteristic. The feedback control loop 134 can be realized as an element-level feedback control loop 134 that corresponds to an element-level component chain, examples of which are depicted in FIGS. 3, 4-1, and 4-2.

In some implementations, the antenna array 122 is implemented as at least one antenna array that include multiple antenna elements. Thus, as used herein, an "antenna" can refer to at least one antenna array or at least one antenna element, depending on context. Additional aspects of the wireless interface device 120 and the antenna array 122 in terms of antenna beamforming are described next with reference to FIG. 2. Thereafter, example implementations of an element-level component chain, which are part of an RF front-end 128, are described with reference to FIG. 3. Array-level concepts are described with reference to FIGS. 4-1 and 4-2. Example implementations of the power amplification system 130, as well as element-level control schemes, are then described starting with FIG. 5.

Figure 2:
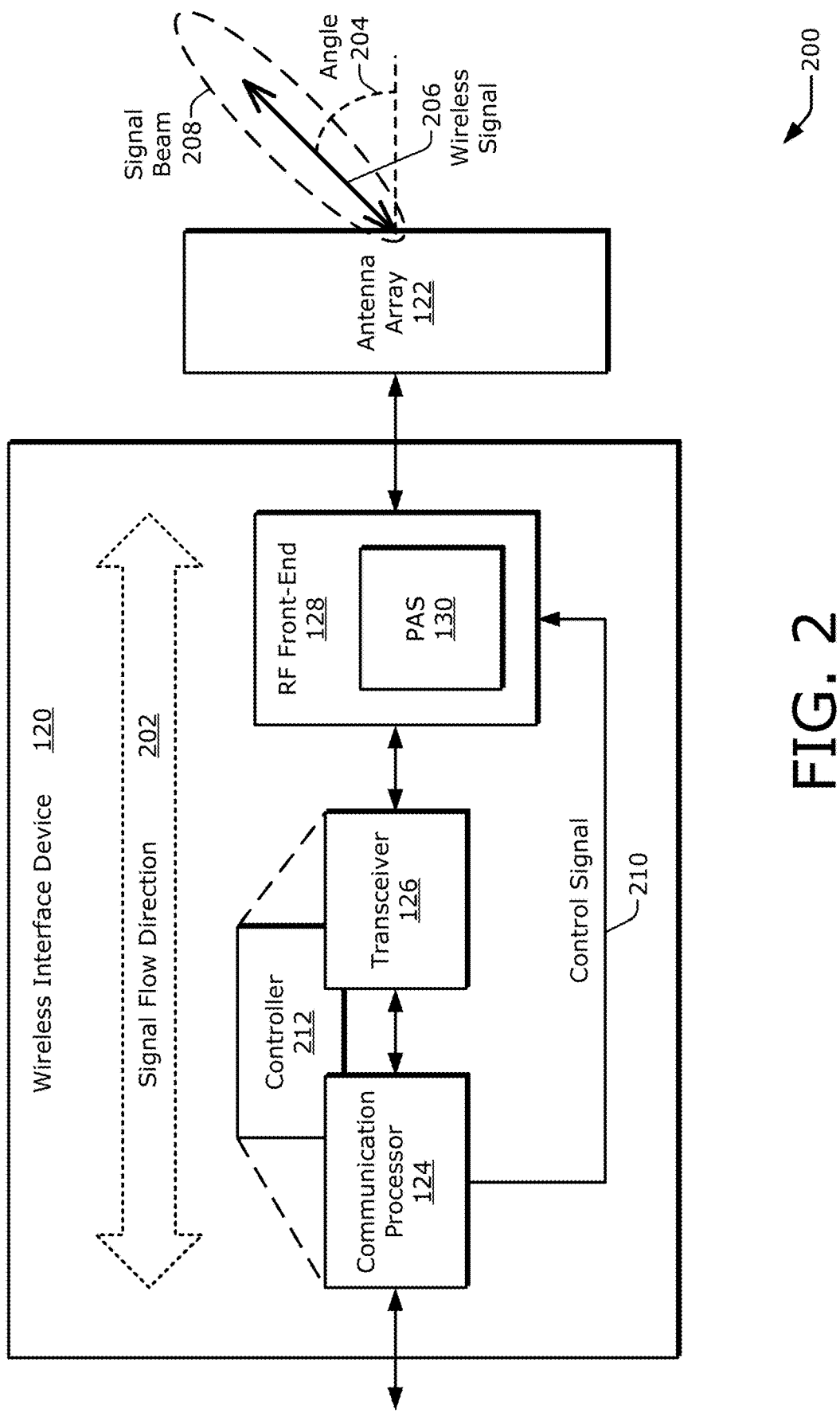
FIG. 2 illustrates an antenna array coupled to an example wireless interface device that includes a communication processor and an RF front-end with at least one power amplification system.

FIG. 2 illustrates at 200 generally the antenna array 122 coupled to an example implementation of the wireless interface device 120. The wireless interface device 120 includes the communication processor 124, the transceiver 126, and the RF front-end 128, which has at least one power amplification system 130 (PAS 130). An example signal flow direction 202 is depicted bidirectionally. Thus, signals can flow in both directions across the wireless interface device 120 to accommodate both transmission and reception signals. Certain portions or components, however, may be implemented unidirectionally, such as the power amplification system 130. As shown, the communication processor 124 is coupled to the transceiver 126, and the transceiver 126 is coupled to the RF front-end 128. Although not explicitly shown, the communication processor 124 can be coupled to other components of the electronic device 102 of FIG. 1, such as the application processor 108, the CRM 110, or the display 118.

Figure 3:
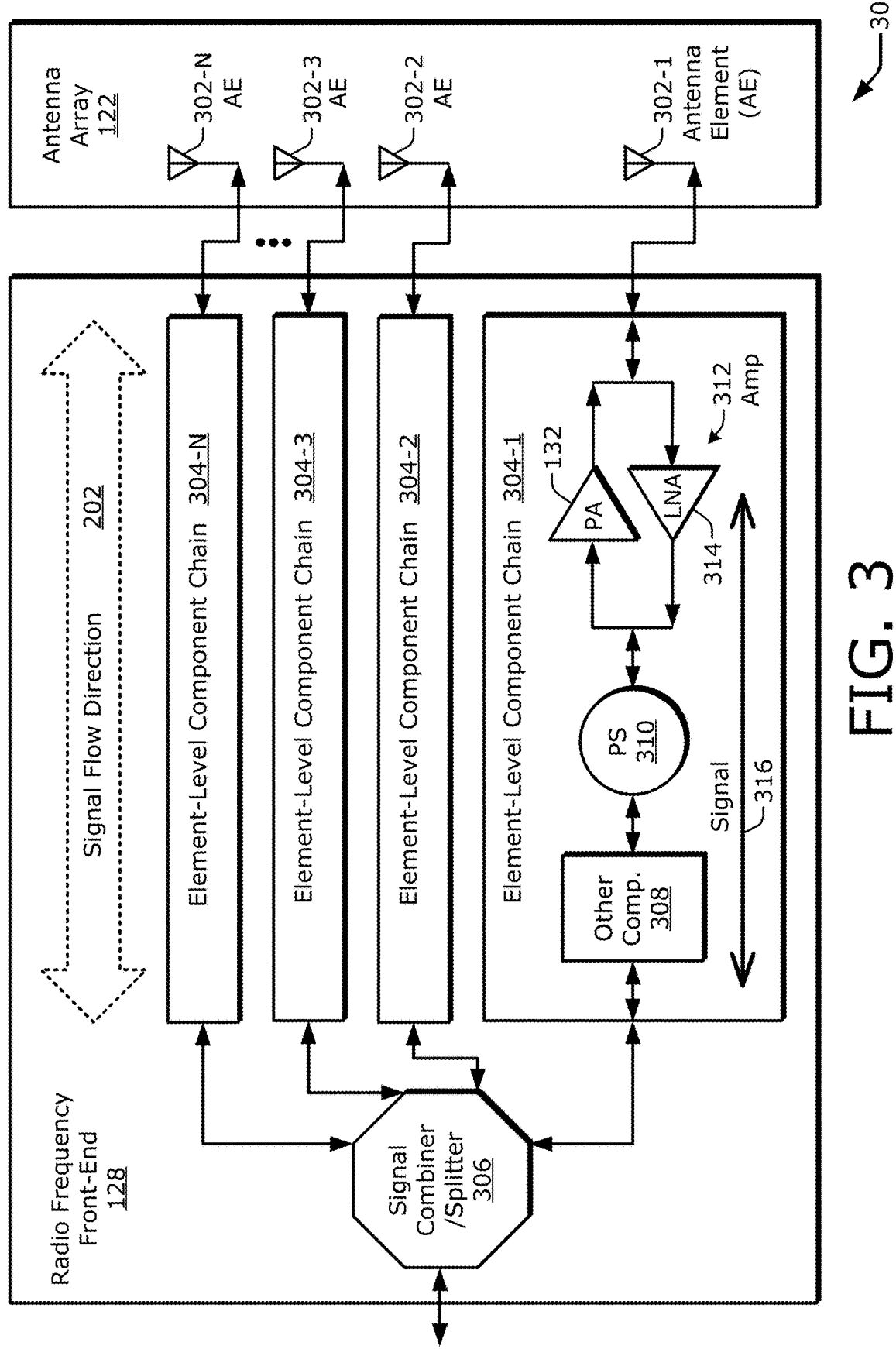
FIG. 3 illustrates an antenna array coupled to an example RF front-end that includes multiple element-level component chains, each of which includes a power amplifier that can be part of a power amplification system.

In operation, the antenna array 122 emanates for transmission or senses for reception at least one wireless signal 206. With antenna beamforming, the wireless signal 206 can be transmitted or received via at least one signal beam 208. Using beamsteering, the wireless signal 206 can therefore be transmitted or received relative to at least one angle 204 to provide for wireless communication directionality. To do so, using phased-array techniques for instance, each phase shifter (e.g., as depicted in FIG. 3) of the RF front-end 128 shifts a phase of a version of a signal propagating through the phase shifter. The propagating signal can be previously received as the wireless signal 206 or can be targeted for transmission as the wireless signal 206. With respect to the power amplification system 130, the phase shifter shifts a phase of a signal version that is then amplified by a power amplifier (not shown in FIG. 2) of the power amplification system 130.

An amount of a signal gain of a signal version that is to be amplified by the power amplification system 130 can be controlled by the communication processor 124 using at least one control signal 210. The communication processor 124 can generate the control signal 210 responsive to power levels detected in the RF front-end 128 or proximate to the antenna array 122. The communication processor 124 can also set the control signal 210 responsive to a target radiated power level. Alternatively, the transceiver 126 can generate or provide the control signal 210. More generally, a controller 212 that is part of at least one of the communication processor 124 or the transceiver 126 can generate or provide the control signal 210.

Figure 5:
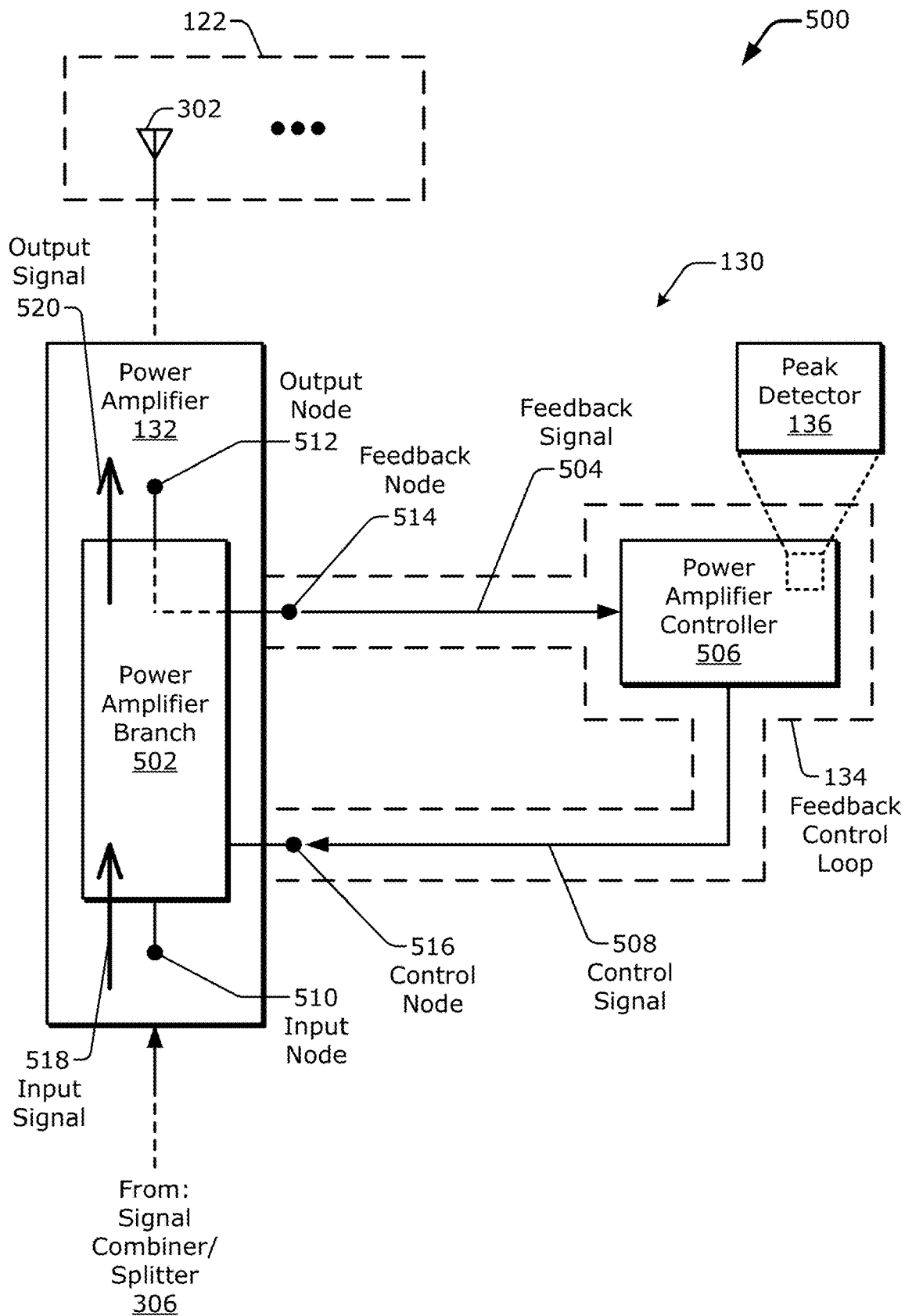
FIG. 5 is a schematic diagram illustrating an example power amplification system including a power amplifier and a feedback control loop having a power amplifier controller with a peak detector.

FIG. 3 illustrates at 300 generally the antenna array 122 coupled to an example RF front-end 128 that includes multiple element-level component chains 304-1, 304-2, 304-3, ..., 304-N, with "N" representing a positive integer (e.g., two or more for beamforming) Here, each element-level component chain 304 includes at least one power amplifier 132 that can be part of a power amplification system 130 (e.g., of FIGS. 1, 2, and 5). The antenna array 122 includes multiple antenna elements 302-1, 302-2, 302-3, ..., 302-N, with "N" representing a positive integer (e.g., two or more for beamforming) Each respective antenna element 302 (AE 302) of the multiple antenna elements 302-1 ... 302-N is coupled to a respective element-level component chain 304 of the multiple element-level component chains 304-1 ... 304-N. For example, a first element-level component chain 304-1 is coupled to a first antenna element 302-1, and a second element-level component chain 304-2 is coupled to a second antenna element 302-2.

In example implementations, each element-level component chain 304 of the multiple element-level component chains 304-1 ... 304-N is coupled to a signal combiner/splitter 306. The signal combiner/splitter 306 can function to combine signals for reception and/or split a signal for transmission. For example, the signal combiner/splitter 306 can combine multiple signal versions accepted from the multiple element-level component chains 304-1 ... 304-N into a combined signal for a receiving operation. The signal combiner/splitter 306 can also split a signal into multiple signal versions and provide the versions to the multiple element-level component chains 304-1 ... 304-N for a transmitting operation. Although a single four-to-one signal combiner/splitter 306 is explicitly illustrated, multiple signal combiner/splitters may be implemented instead. For example, two two-to-one signal combiner/splitters may be coupled to the multiple element-level component chains 304-1 ... 304-N, where "N" equals four.

As illustrated, each element-level component chain 304 respectively includes an amplifier 312 (Amp 312), a phase shifter 310 (PS 310), and at least one other component 308 (Other Comp. 308). The amplifier 312 includes the power amplifier 132 (PA 132) and a low-noise amplifier 314 (LNA 314). However, a given element-level component chain 304 can include more, fewer, or different components. The signal flow direction 202 along each element-level component chain 304 can be bidirectional as indicated by the double-headed arrow.

As shown, these physical components of a respective element-level component chain 304 are coupled together in series between the signal combiner/splitter 306 and the respective corresponding antenna element 302 of the antenna array 122. The other component 308 is electrically nearest the signal combiner/splitter 306, and the amplifier 312 is nearest the antenna element 302. The phase shifter 310 is therefore coupled between the other component 308 and the amplifier 312. An output of the power amplifier 132 is coupled to the antenna element 302, and an input of the low-noise amplifier 314 is coupled to the antenna element 302. However, the order or interconnections of these physical components in a given element-level component chain 304 may differ.

The amplifier 312 can be implemented in different manners. For example, the amplifier 312 can be implemented with the power amplifier 132 for transmission operations or with the low-noise amplifier 314 for reception operations. The amplifier 312 may also be implemented with both the power amplifier 132 and the low-noise amplifier 314 in accordance with an inclusive interpretation of the disjunctive "or," as is set forth below. The phase shifter 310 can therefore provide a phase-shifted signal to the power amplifier 132 for amplification and forwarding to the corresponding antenna element 302 for emanation therefrom. The phase shifter 310 can also or instead accept an amplified signal from the low-noise amplifier 314 for phase shifting and then forwarding to the other component 308, or for forwarding "directly" to the signal combiner/splitter 306 if no other component 308 is present. The other component 308 can be realized as a filter, another amplifier, a mixer, a buffer, and so forth. Given that the illustrated other component 308 is part of the first element-level component chain 304-1 and is not also part of a signal propagation path with another element-level component chain that leads to a different antenna element 302, the other component 308 represents an example of an element-level component 308. The phase shifter 310 and the amplifier 312, as well as the power amplifier 132 and the low-noise amplifier 314 thereof, are likewise element-level components.

In FIG. 3, a signal 316 is depicted with regard to the element-level component chain 304-1 by way of example. The signal 316 can propagate along the element-level component chain 304-1 between the signal combiner/splitter 306 and the antenna element 302-1. Each signal 316 can represent a version of the wireless signal 206 (of FIG. 2). Other respective signal versions can be propagating through other respective element-level component chains. The signal 316 can be realized as a bidirectional signal, a unidirectional signal, or a combination thereof as the signal 316 traverses different parts of the element-level component chain 304-1.

In example operations, each respective element-level component chain 304 adjusts or conditions the respective signal 316 propagating between the signal combiner/splitter 306 and a respective antenna element 302. Thus, each respective element-level component chain 304 modifies the signal version to produce a respective signal version having a different respective phase or amplitude that is appropriate for providing to or accepting from a respective antenna element 302 to support a beamsteering operation. To do so, the phase shifter 310 can perform a phase shifting operation on the signal 316. Further, for transmission operations, the power amplifier 132 can amplify the phase-shifted signal 316 and provide an amplified signal 316 to the corresponding antenna element 302 of the antenna array 122. This element-level amplification is described below with reference to FIG. 5. Next, however, array-level architecture and control schemes are described with reference to FIGS. 4-1 and 4-2.

Figures 1, 4:
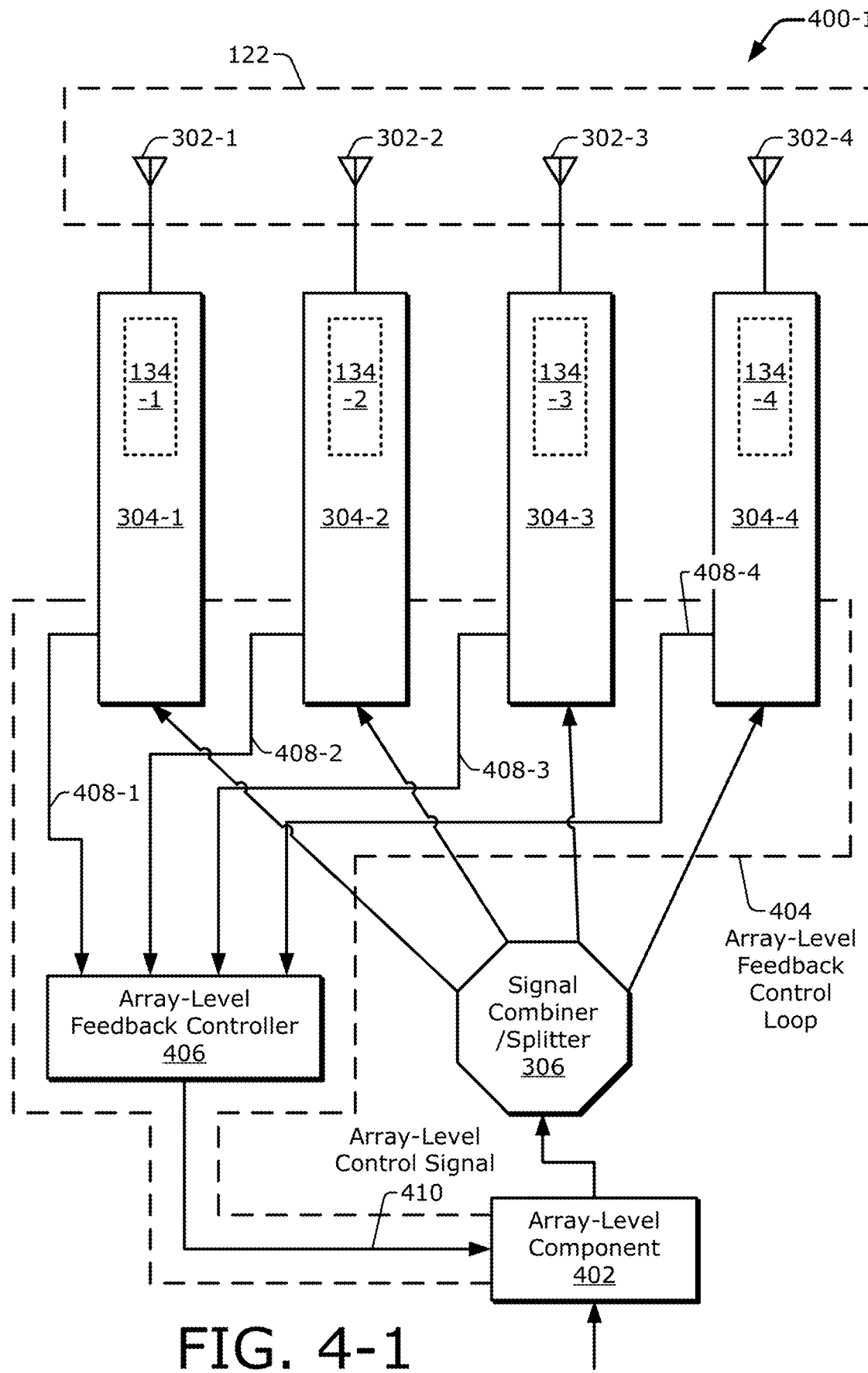
Figures 2, 4:
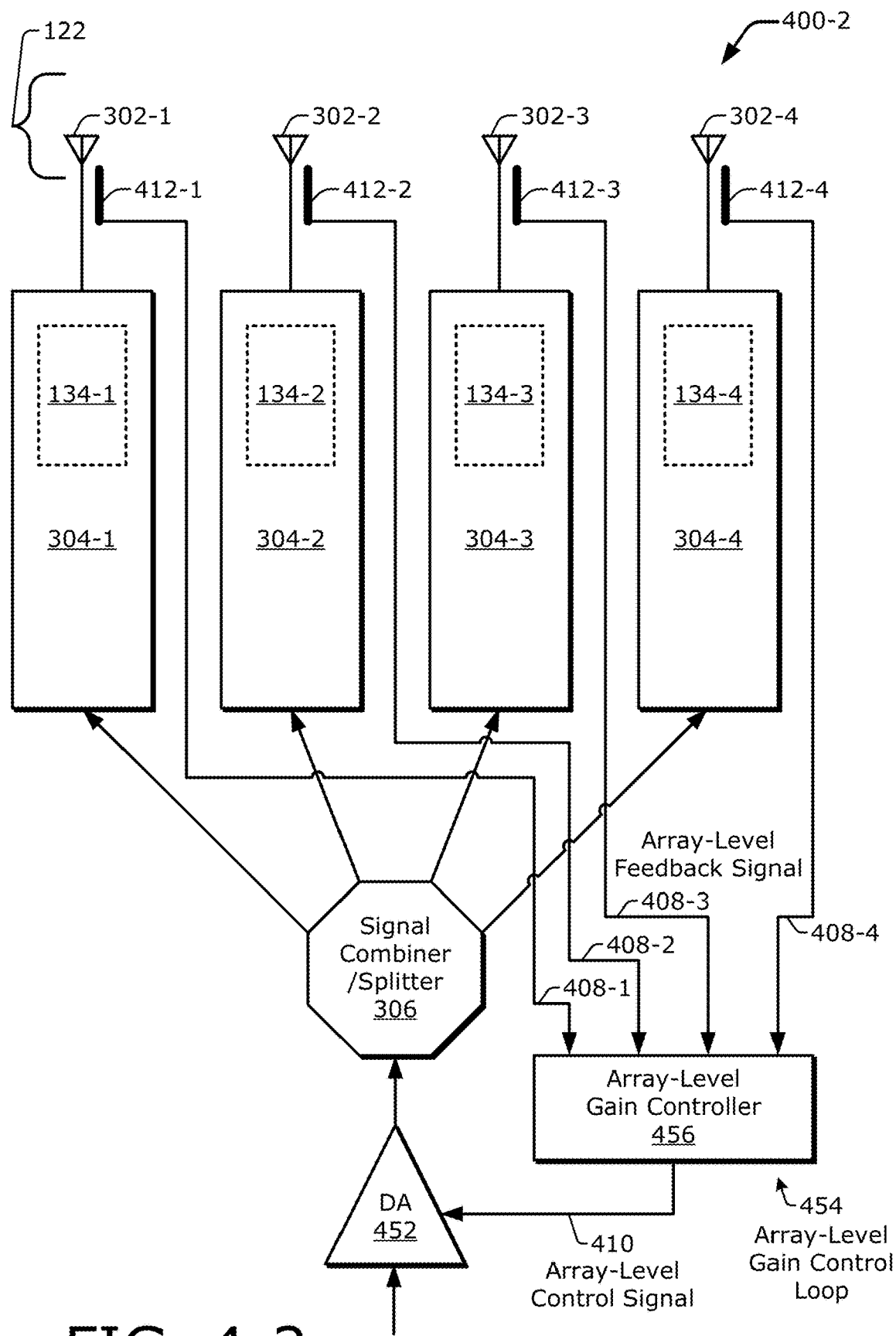

FIG. 4-1 illustrates an example array-level architecture 400-1 including an antenna array 122, which is coupled to multiple element-level component chains 304-1 . . . 304-4, and an example array-level feedback control loop 404. In some environments described herein, an example quantity of multiple antenna elements 302-1 . . . 302-N of the antenna array 122 and an example quantity of multiple element-level component chains 304-1 . . . 304-N is four (e.g., "N" equals four). However, the described principles are applicable to other quantities of antenna elements, element-level component chains, element-level feedback control loops, power amplification systems, and so forth.

For certain implementations, the architecture of FIG. 4-1 depicts array-level circuitry versus element-level circuitry. Here, the terms "array-level" and "element-level" refer to aspects of an antenna and the circuitry that supports or is coupled to the antenna. At the array level, circuits operate on at least one signal that pertains to multiple antenna elements 302-1 . . . 302-4 of the antenna array 122, including possibly up to all such antenna elements. For example, an array-level component 402 and the signal combiner/splitter 306 both operate on a signal that is ultimately coupled to each antenna element 302 of the multiple antenna elements 302-1 . . . 302-4, perhaps after conditioning or splitting into different signal versions. Thus, actions that alter the operation of array-level circuitry, such as gain adjustment or frequency translation operations, impact signals corresponding to multiple antenna elements 302-1 . . . 302-4 of the antenna array 122.

In contrast, at the element level, circuits operate on a signal version that pertains to a single corresponding antenna element 302 of the multiple antenna elements 302-1 . . . 302-4 of the antenna array 122. Thus, each element-level component chain 304 operates at the element level. Further, each physical component of a given element-level component chain 304 operates at the element level. The power amplifier 132 (e.g., of FIGS. 3 and 5) and the feedback control loop 134 of each element-level component chain 304 therefore perform their respective functions at the element level. Each feedback control loop 134 is part of, and operates on a signal version corresponding to, a respective element-level component chain 304. Accordingly, each feedback control loop 134 operates as an element-level feedback control loop 134. These element-level architectural concepts are described further below with reference to FIG. 5. Unless context dictates otherwise, if circuitry or a component does not specify being pertinent to an array-level architectural aspect, such circuitry or component is pertinent to an element-level architectural aspect.

As illustrated in FIG. 4-1, each respective antenna element 302 of the multiple antenna elements 302-1 . . . 302-4 is coupled to a respective element-level component chain 304 of the multiple element-level component chains 304-1 . . . 304-4. Each respective element-level component chain 304 of the multiple element-level component chains 304-1 . . . 304-4 includes a respective element-level feedback control loop 134 of multiple element-level feedback control loops 134-1 . . . 134-4. More specifically, a first element-level component chain 304-1 includes a first element-level feedback control loop 134-1, and a second element-level component chain 304-2 includes a second element-level feedback control loop 134-2. Additionally, a third element-level component chain 304-3 includes a third element-level feedback control loop 134-3, and a fourth element-level component chain 304-4 includes a fourth element-level feedback control loop 134-4.

Each element-level component chain 304 of the multiple element-level component chains 304-1 . . . 304-N is coupled to the signal combiner/splitter 306. The signal combiner/splitter 306 is coupled to the array-level component 402. As shown by the example arrow directions, which flow from the array-level component 402 toward the multiple antenna elements 302-1 . . . 302-4, the depicted architecture can perform at least transmission operations. The array-level feedback control loop 404, on the other hand, has arrows flowing in a different "opposite" direction to provide array-level feedback signaling as is described below.

In example implementations, the array-level feedback control loop 404 is coupled between each of the multiple element-level component chains 304-1 . . . 304-4 and the array-level component 402. The array-level feedback control loop 404 includes an array-level feedback controller 406. The array-level feedback controller 406 can be part of any portion of the wireless interface device 120, such as the communication processor 124 or the transceiver 126. Each element-level component chain 304 is coupled to the array-level feedback controller 406. Each respective element-level component chain 304 of the multiple element-level component chains 304-1 . . . 304-4 provides a respective array-level feedback signal 408 of multiple array-level feedback signals 408-1, 408-2, 408-3, and 408-4. For example, the first element-level component chain 304-1 provides a first array-level feedback signal 408-1 to the array-level feedback controller 406, and the second element-level component chain 304-2 provides a second array-level feedback signal 408-2 to the array-level feedback controller 406. Each array-level feedback signal 408 provides a value to the array-level feedback controller 406 for analysis as is described below.

The array-level feedback controller 406 accepts the multiple array-level feedback signals 408-1 . . . 408-4 from the multiple element-level component chains 304-1 . . . 304-4. The array-level feedback controller 406 processes the multiple array-level feedback signals 408-1 . . . 408-4 to produce an array-level control signal 410. The array-level feedback controller 406 provides the array-level control signal 410 to the array-level component 402 to adjust an array-level operational parameter of the array-level component 402. Based on the adjusted array-level operational parameter, the array-level component 402 processes a signal that is targeted for transmission before providing the processed signal to the signal combiner/splitter 306. The signal combiner/splitter 306 splits the processed signal and provides a respective split version of the processed signal to a respective element-level component chain 304. A specific example of array-level architecture is described with reference to FIG. 4-2.

FIG. 4-2 illustrates an example array-level architecture 400-2 including an antenna array 122, which is coupled to multiple element-level component chains 304-1 . . . 304-4, and an example array-level gain controller 456 coupled to a driver amplifier 452. The array-level architecture 400-2 has an array-level gain control loop 454 that includes the array-level gain controller 456 and at least a control input of the driver amplifier 452. The array-level gain control loop 454 also includes multiple couplers 412-1 . . . 412-4, as is described below. In this example, the array-level feedback controller 406 (of FIG. 4-1) is realized as the array-level gain controller 456, and the array-level component 402 (also of FIG. 4-1) is realized as the driver amplifier 452 (DA 452). Thus, the array-level feedback control loop 404 is realized as the array-level gain control loop 454.

As shown, the RF front-end 128 (e.g., of FIG. 3) includes at least one coupler 412 of multiple couplers 412-1 . . . 412-4 for each antenna element 302 of the multiple antenna elements 302-1 . . . 302-4. For example, a first coupler 412-1 is associated with a first antenna element 302-1, and a second coupler 412-2 is associated with a second antenna element 302-2. Further, a third coupler 412-3 is associated with a third antenna element 302-3, and a fourth coupler 412-4 is associated with a fourth antenna element 302-4. Each respective coupler 412 of the multiple couplers 412-1 . . . 412-4 is coupled to the array-level gain controller 456 to provide a respective array-level feedback signal 408 of the multiple array-level feedback signals 408-1 to 408-4.

In example implementations, each coupler 412 is electromagnetically coupled to a corresponding antenna element 302 or to an antenna lead that is electrically coupled thereto. The coupler 412 senses a power level associated with the corresponding antenna element 302 and provides the sensed power level to the array-level gain controller 456 as the array-level feedback signal 408. Thus, each respective array-level feedback signal 408 provides an indication of a respective transmit power level of a respective antenna element 302. The array-level gain controller 456 processes the multiple transmit power levels to produce the array-level control signal 410.

The array-level gain controller 456 may also produce the array-level control signal 410 based on at least one radio-frequency (RF) gain index (RGI) input. The RGI input may be at least partially controlled at the system level based on a requested power level and using at least one codebook. The driver amplifier 452 adjusts a gain responsive to the array-level control signal 410. In these manners, an array-level gain control can be implemented by controlling a gain of a driver amplifier that provides a signal to multiple ones of the multiple element-level component chains 304-1 . . . 304-4. Element-level control schemes that are described herein can operate with respect to each element-level component chain 304 without adversely impacting such array-level control schemes.

FIG. 5 is a schematic diagram 500 illustrating an example power amplification system 130 including at least one power amplifier 132 and at least one feedback control loop 134. As shown, the power amplifier 132 includes at least one power amplifier branch 502. The feedback control loop 134 has at least one power amplifier controller 506 including at least one peak detector 136. The power amplifier 132 is coupled to an antenna element 302 of the antenna array 122. The power amplifier 132 is also coupled to a signal combiner/splitter 306. The power amplification system 130 further includes at least one input node 510, at least one output node 512, at least one feedback node 514, and at least one control node 516.

In example implementations, the power amplifier 132 includes the input node 510 and the output node 512. The power amplifier branch 502 includes at least one transistor (not shown in FIG. 5) and is coupled between the input node 510 and the output node 512. The output node 512 is coupled to the antenna element 302. The output node 512 is also coupled to the feedback node 514. The feedback control loop 134 is coupled between the feedback node 514 and the control node 516.

In example operations, the power amplifier branch 502 amplifies an input signal 518 that is accepted at the input node 510 and provides an output signal 520 at the output node 512. The power amplifier controller 506 obtains a feedback signal 504 via the feedback node 514. The feedback signal 504 can reflect a sensed operational characteristic, such as a voltage level or a current magnitude. For instance, the peak detector 136 can sense a peak voltage level to obtain the feedback signal 504. In some cases, the peak detector 136 can determine at least one approximately maximum amplitude of a signal at the output node 512 of the power amplification system 130.

Responsive to the feedback signal 504, the power amplifier controller 506 produces a control signal 508. The power amplifier controller 506 provides the control signal 508 to the power amplifier 132 via the control node 516. The control signal 508 can adjust an operational parameter of the power amplifier 132. Examples of an operational parameter include a bias voltage for a transistor of the power amplifier branch 502, a supply voltage for the power amplifier branch 502, and so forth.

As illustrated, the feedback control loop 134 operates as an element-level feedback control loop 134 because it obtains the feedback signal 504 from a given power amplifier 132 within a particular element-level component chain 304 and returns the control signal 508 to the same power amplifier 132 of the same element-level component chain 304. However, the feedback control loop 134 can function as an element-level feedback control loop 134 even if the control loop supplies the control signal 508 to a different component so long as, for example, the different component is within the same element-level component chain 304 as the given power amplifier 132. Thus, the element-level feedback control loop 134 can alternatively provide the control signal 508 to another component within the same element-level component chain 304, such as the low-noise amplifier 314, the phase shifter 310, or the other component 308 (e.g., all of at least FIG. 3). Further, the feedback control loop 134 can provide the control signal 508 to a driver amplifier that amplifies a signal version propagating through the same element-level component chain 304, but not through other component chains. In other words, the other component 308 may be implemented as an element-level driver amplifier.

The power amplifier system 130 depicted in FIG. 5 represents an example power amplifier system for a given element-level component chain 304 of multiple element-level component chains 304-1 . . . 304-N (e.g., of FIG. 3). Accordingly, each respective element-level component chain 304 may include a respective power amplifier system 130. Thus, in some implementations in which "N" equals at least two, a first element-level component chain 304-1 can include a first power amplification system 130, and a second element-level component chain 304-2 can include a second power amplification system 130. The first power amplification system 130 may include a first power amplifier 132 and a first feedback control loop 135. Similarly, the second power amplification system 130 may include a second power amplifier 132 and a second feedback control loop 135. The first power amplifier 132 of the first power amplification system 130 can therefore include at least one first power amplifier branch 502. Similarly, the second power amplifier 132 of the second power amplification system 130 can therefore include at least one second power amplifier branch 502. In a differential architecture, the first power amplifier branch 502 can include a first plus power amplifier branch and a first minus power amplifier branch. Similarly, the second power amplifier branch 502 can include a second plus power amplifier branch and a second minus power amplifier branch. Example differential architectures are described below with reference to FIGS. 6 and 7.

Figure 6:
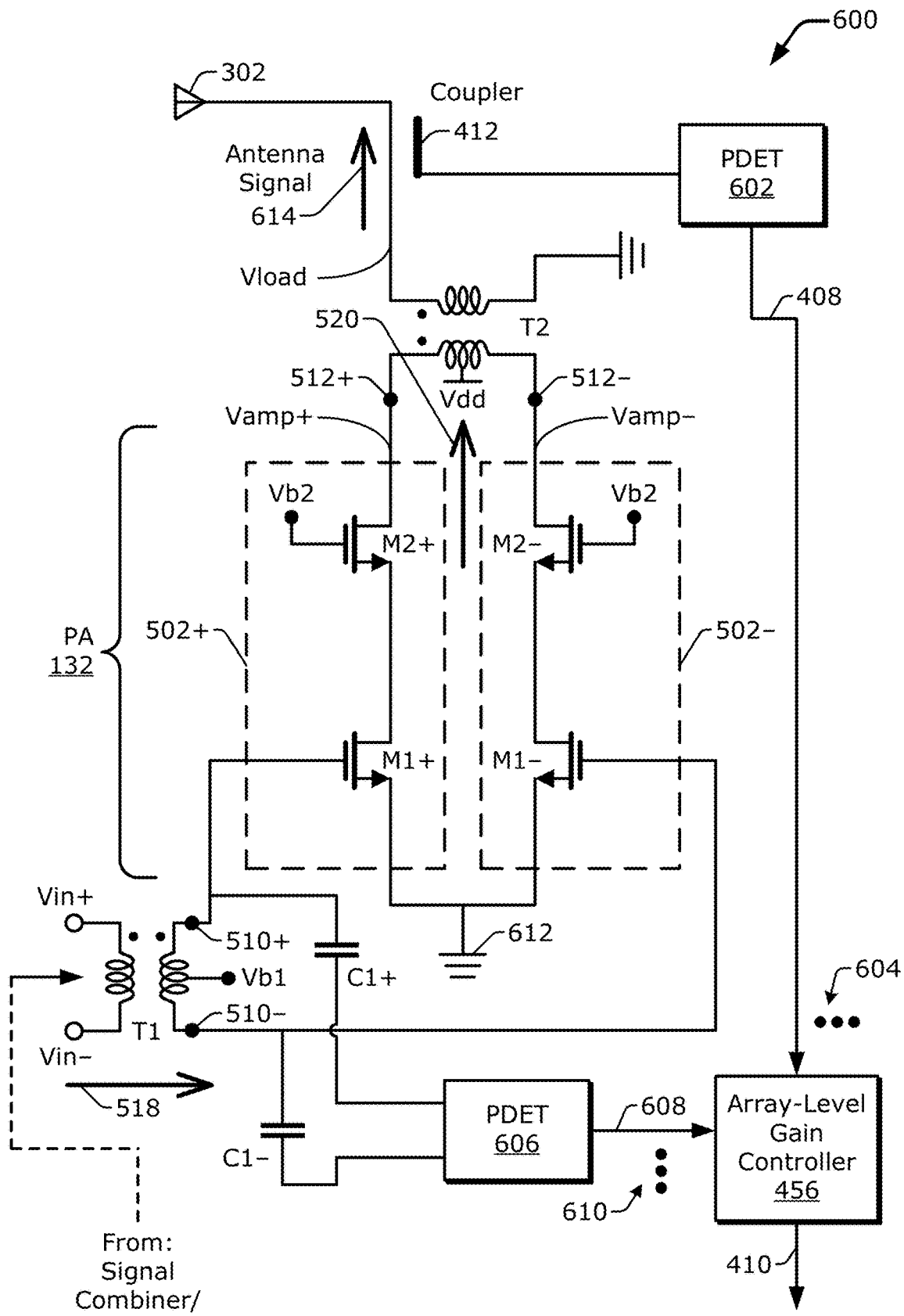
FIG. 6 is a circuit diagram illustrating an example power amplifier that can operate in conjunction with an example array-level control scheme.

FIG. 6 is a circuit diagram 600 illustrating an example power amplifier 132 that can operate in conjunction with an example array-level control scheme. As shown, the power amplifier 132 includes two power amplifier branches and four transistors, with two transistors per power amplifier branch. The circuit diagram 600 also includes a transformer T1, a transformer T2, and an antenna element 302 that are each disposed along a propagation path for an information signal being transmitted. This propagation path can extend between, for instance, the input signal 518 and the output signal 520. An array-level control scheme includes a power detector 602 (PDET 602), a power detector 606 (PDET 606), an array-level feedback signal 408, another array-level feedback signal 608, an array-level gain controller 456, and an array-level control signal 410.

In example implementations, the power amplifier 132 includes a plus power amplifier branch 502+ and a minus power amplifier branch 502−. Each power amplifier branch 502 comprises at least a first transistor and a second transistor. Specifically, each power amplifier branch 502 includes a first transistor M1 and a second transistor M2 coupled together in series in a cascode arrangement. Thus, the first transistor M1 functions as an input or main transistor, and the second transistor M2 functions as a cascode transistor. Each transistor includes multiple terminals: at least one gate terminal and one or more channel terminals. The channel terminals may include at least one drain terminal and at least one source terminal.

A gate terminal of the first transistor M1 is coupled to the input node 510, and a source terminal of the first transistor M1 is coupled to a ground node 612. A drain terminal of the first transistor M1 is coupled to a source terminal of the second transistor M2. A drain terminal of the second transistor M2 is coupled to the output node 512. Thus, the first transistor M1 is coupled in series with the second transistor M2 along channels of each transistor between the output node 512 and the ground node 612.

Each transistor is depicted as a field-effect transistor (FET). However, each transistor may be realized as a different transistor type, such as a bipolar junction transistor (BJT). Each FET transistor can be implemented as a junction FET (JFET), a metal-oxide-semiconductor (MOS) FET (MOSFET), and so forth. Each transistor M1 and M2 is depicted as an n-type MOSFET (nMOSFET). However, the transistors may instead be implemented with a p-type MOSFET (pMOSFET). In such cases, the order of amplification between the first transistor M1 and the second transistor M2 may be swapped.

With regard to an example differential amplifier architecture, the power amplifier 132 comprises at least a first plus transistor, a second plus transistor, a first minus transistor, and a second minus transistor. More specifically, the plus power amplifier branch 502+ includes a first plus transistor M1+ and a second plus transistor M2+. The minus power amplifier branch 502− includes a first minus transistor M1− and a second minus transistor M2−. From a signal propagation perspective, the plus power amplifier branch 502+ is coupled between a plus input node 510+ and a plus output node 512+. Similarly, the minus power amplifier branch 502− is coupled between a minus input node 510− and a minus output node 512−.

The power amplifier 132 is coupled to the first transformer T1 via the plus and minus input nodes 510+ and 510−. The power amplifier 132 is also coupled to the power detector 606 via the plus and minus input nodes 510+ and 510−. A first plus alternating-current (AC) capacitor C1+ is coupled between the plus input node 510+ and a plus input of the power detector 606. A first minus AC capacitor C1− is coupled between the minus input node 510− and a minus input of the power detector 606. The power detector 606 is coupled to the array-level gain controller 456.

The power amplifier 132 is coupled to the second transformer T2 via the plus and minus output nodes 512+ and 512−. The second transformer T2 is further coupled between the power amplifier 132 and the antenna element 302. A coupler 412 is electromagnetically coupled to the antenna element 302 or the antenna lead line thereof. The coupler 412 is coupled to the power detector 602, which is coupled to the array-level gain controller 456. Each of the first transformer T1 and the second transformer T2 includes at least two inductors. Although the power amplifier 132 is described as being coupled to other parts of an RF front-end or a transmit chain via transformers, the couplings can be implemented in alternative manners, such as via AC coupling capacitors.

The circuit diagram 600 also illustrates multiple voltages. A first bias voltage Vb1 (at a first bias voltage node) is coupled to the gate terminals of the first plus and minus transistors M1+ and M1−. A second bias voltage Vb2 (at a second bias voltage node) is coupled to the gate terminals of the second plus and minus transistors M2+ and M2−. A supply voltage Vdd is coupled to the drain terminals of the second plus and minus transistors M2+ and M2−. As shown for the first bias voltage Vb1 and the supply voltage Vdd, these voltages may be coupled to a terminal of a transistor via at least part of an inductor that forms a transformer.

In example operations, the first transformer T1 accepts a differential input signal 518 with a plus input voltage Vin+ and a minus input voltage Vin−. The differential signal is received from the signal combiner/splitter 306 directly or through one or more other components, such as a phase shifter or buffer. The power amplifier 132 amplifies the input signal 518 to produce an amplified output signal 520 at the plus and minus output nodes 512+ and 512−. The input signal 518 is amplified by the main transformer (first transformer M1) and the cascode transformer (second transformer M2) to output a plus amplified voltage Vamp+ and a minus amplified voltage Vamp− at the plus output node 512+ and the minus output node 512−, respectively.

The amplified output signal 520 includes a fundamental frequency and one or more harmonic frequencies. The amplified output signal 520 is propagated through the second transformer T2. The second transformer T2 converts the differential output signal 520 into a single-ended antenna signal 614 in this instance. The output signal 520 is therefore forwarded to the antenna element 302 as an antenna signal 614 having a load voltage Vload. Due to the filtering effect by the second transformer T2, especially at higher frequencies, the amplitudes of the harmonics are attenuated in the load voltage Vload as compared to the amplified voltage Vamp. As a result, the voltage level of the amplified voltage Vamp at the drains of the second plus and minus transistors M2+ and M2− can be higher than the voltage level of the load voltage Vload. Moreover, the amplified voltage Vamp does not monotonically increase with the load voltage Vload. Consequently, the power sensed by the coupler 412 may not accurately reflect the voltage level at, and thus the stress being experienced by, the drains of the second plus and minus transistors M2+ and M2−. This issue is addressed with the element-level feedback control loop 134 described below with reference to FIG. 7.

With the operation of the example array-level control scheme, the input power detector 606 detects the power of the input signal 518 and provides the detected input power as the other array-level feedback signal 608. As indicated by the ellipsis 610, analogous input power detectors provide an input signal power indicator to the array-level gain controller 456 for other power amplifiers that are part of other element-level component chains for at least a same antenna array. On the antenna element side of the circuit diagram 600, the antenna power detector 602 detects the power of the antenna signal 614 (e.g., with load voltage Vload) and provides the detected antenna power as the array-level feedback signal 408. As indicated by the ellipsis 604, analogous antenna power detectors provide an antenna signal power indicator to the array-level gain controller 456 for the other antenna elements, which are associated with the other element-level component chains, for at least the same antenna array. The array-level gain controller 456 produces the array-level control signal 410 from the multiple array-level feedback signals 408 and the multiple other array-level feedback signals 608 obtained from the input and antenna power detectors 606 and 602 of each element-level component chain 304 of multiple element-level component chains 304-1 . . . 304-4 (e.g., of FIGS. 4-1 and 4-2).

Figure 7:
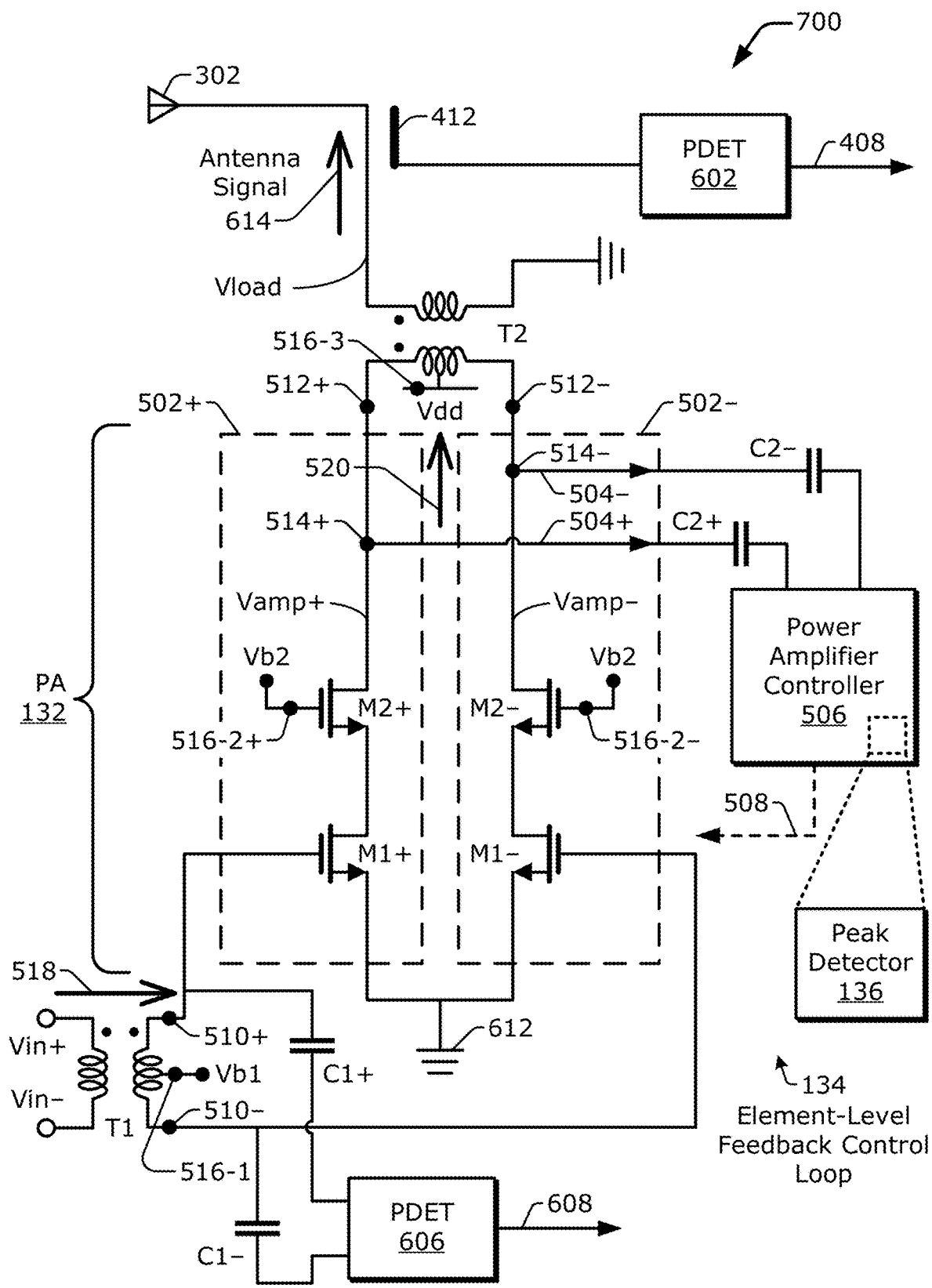
FIG. 7 is a circuit diagram illustrating an example power amplifier that can operate in conjunction with an example element-level control scheme including a power amplifier controller.

FIG. 7 is a circuit diagram 700 illustrating an example power amplifier 132 that can operate in conjunction with an example element-level control scheme that is implemented by an element-level feedback control loop 134. The element-level feedback control loop 134 includes the power amplifier controller 506 and the at least one peak detector 136. The circuit diagram 700 also depicts at least one feedback node 514 and at least one control node 516. More specifically, at least one first control node 516-1, at least one second control node 516-2, and at least one third control node 516-3 are shown. The power amplifier 132 is described in terms of differential signaling; however, the power amplifier 132 and the associated element-level control scheme can be employed in single-ended signaling environments.

In example implementations, the first control node 516-1 is coupled to the input node 510 and corresponds to the first bias voltage Vb1. The second control node 516-2 is coupled to the gate terminal of the second transistor M2 and corresponds to the second bias voltage Vb2. Here, the second plus control node 516-2+ is coupled to the gate terminal of the second plus transistor M2+ and corresponds to the second bias voltage Vb2. The second minus control node 516-2− is coupled to the gate terminal of the second minus transistor M2− and also corresponds to the second bias voltage Vb2. The third control node 516-3 is coupled to the output node 512 and corresponds to the supply voltage Vdd.

The power amplifier controller 506 is coupled to the power amplifier 132 via the plus and minus feedback nodes 514+ and 514−, respectively. The plus feedback node 514+ is coupled to the plus output node 512+, and the minus feedback node 514− is coupled to the minus output node 512−. As shown, the plus feedback node 514+ may further be co-positioned with the plus output node 512+ such that the two nodes can share a common electrical equipotential. Similarly, the minus feedback node 514− may further be co-positioned with the minus output node 512− such that the two nodes can share a common electrical equipotential. Alternatively, at least one circuit component may be coupled between a feedback node 514 and an output node 512.

A second plus AC capacitor C2+ is coupled between the plus feedback node 514+ and a plus input of the power amplifier controller 506. A second minus AC capacitor C2− is coupled between the minus feedback node 514− and a minus input of the power amplifier controller 506. The power amplifier controller 506 produces the control signal 508. To provide the control signal 508 to a control node 516, an output of the power amplifier controller 506 is coupled to at least one of the first, second, or third control node 516-1, 516-2, or 516-3.

In example operations, the at least one peak detector 136 of the power amplifier controller 506 is coupled to at least one feedback node 514. The peak detector 136 detects a voltage level at the feedback node 514, such as at the plus feedback node 514+ and the minus feedback node 514−, to obtain a plus feedback signal 504+ and a minus feedback signal 504−. Thus, the power amplifier controller 506 obtains the plus amplified voltage Vamp+ and the minus amplified voltage Vamp−. Based on these voltage levels, which may be present at or reflective of conditions at the drains of the second plus and minus transistors M2+ and M2−, the power amplifier controller 506 generates the control signal 508.

Generally, the power amplifier controller 506 compares the feedback signal 504 to at least one threshold level. If the voltage level of the feedback signal 504 exceeds the at least one threshold level, the power amplifier controller 506 generates the control signal 508 to lower a control voltage at the control node 516. This is described further with reference to FIG. 8. By reducing the control voltage at the control node 516, the voltage level of the amplified voltage Vamp is lowered to protect the drains of the second transistors M2. This extends the useful life of the cascode transistors.

The element-level feedback control loop 134 for the illustrated power amplifier 132 can function substantially independently of other element-level feedback control loops for other power amplifiers that feed other antenna elements of a same antenna array. Meanwhile, the array-level feedback control loop 404 (e.g., of FIG. 4-1) can continue to operate as instructed by a system-level controller. If the power amplifier controller 506 reduces the voltage level of the amplified voltage Vamp, and thus the voltage level of the load voltage Vload, the antenna power detector 602 will detect the lower power output. This may lead to the array-level control loop trying to increase the power to multiple instances of the multiple element-level component chains, including the power provided to each of the power amplifiers thereof. This is governed, however, by the input power detector 606 at the input of each of the power amplifiers. The other array-level feedback signal 608 provides an indication that prevents the system from over-driving the inputs to the power amplifiers based on a lower power at one or more of the outputs of the power amplifiers, or the antenna elements that are associated therewith.

Figure 8:
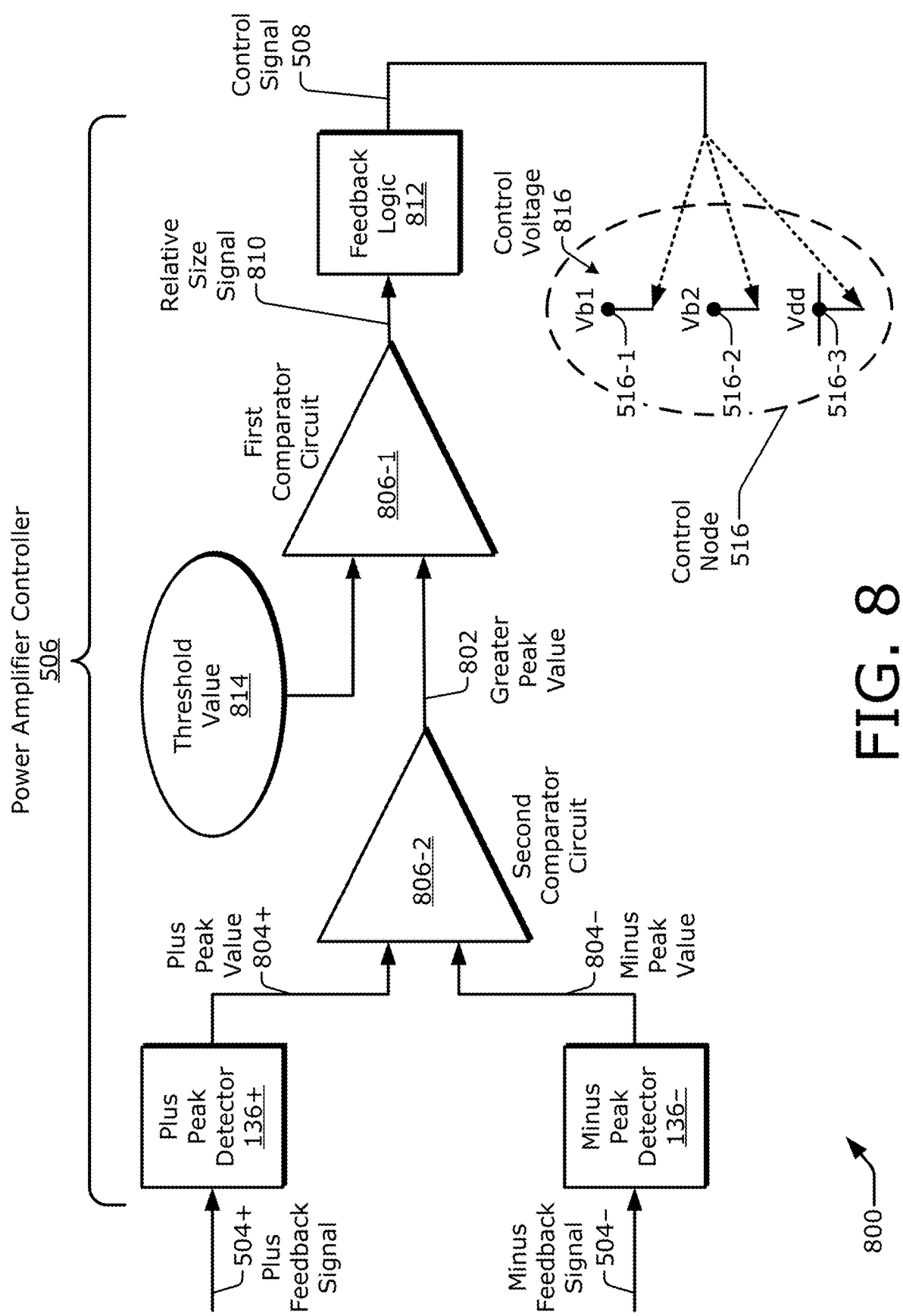
FIG. 8 is a schematic diagram illustrating an example power amplifier controller with at least one peak detector coupled to feedback logic that provides a control signal based on a threshold value.

FIG. 8 is a schematic diagram 800 illustrating an example power amplifier controller 506 with at least one peak detector 136 coupled to feedback logic 812, which provides a control signal 508 based on a threshold value 814. As shown, the at least one peak detector 136 comprises a plus peak detector 136+ and a minus peak detector 136− to accommodate a differential implementation of the power amplifier 132 (e.g., of FIG. 7). Each peak detector 136 includes an input terminal and an output terminal and is responsible for detecting a peak value of a voltage level. The power amplifier controller 506 also includes a first comparator circuit 806-1 and a second comparator circuit 806-2. Each comparator circuit 806 includes a first input terminal, a second input terminal, and an output terminal.

In example implementations, the threshold value 814 is established based on a voltage level that provides a targeted safety level for the second transistors M2. For example, the established voltage level (e.g., for the amplified voltage Vamp of FIG. 7) can be set so as to ensure to a specified degree that the drains of the cascode transistors will not be damaged or prematurely worn based on a structure, a technology, or another physical characteristic of these transistors.

The input terminal of the plus peak detector 136+ is coupled to the plus feedback node 514+ (of FIG. 7). The input terminal of the minus peak detector 136− is coupled to the minus feedback node 514−. The first input terminal of the second comparator circuit 806-2 is coupled to the output terminal of the plus peak detector 136+. The second input terminal of the second comparator circuit 806-2 is coupled to the output terminal of the minus peak detector 136−. The first input terminal of the first comparator circuit 806-1 accepts the threshold value 814. The second input terminal of the first comparator circuit 806-1 is coupled to the output terminal of the second comparator circuit 806-2. The output terminal of the first comparator circuit 806-1 is coupled to an input of the feedback logic 812. The feedback logic 812 produces the control signal 508.

In example operations, the plus peak detector 136+ accepts the plus feedback signal 504+. Responsive to the plus feedback signal 504+, the plus peak detector 136+ produces a plus peak value 804+. The minus peak detector 136− accepts the minus feedback signal 504−. Responsive to the minus feedback signal 504−, the minus peak detector 136− produces a minus peak value 804−. Responsive to the detection of the peak voltage levels, the second comparator circuit 806-2 generates a greater peak value 802 based on the plus peak value 804+ from the plus peak detector 136+ and the minus peak value 804− from the minus peak detector 136−.

The greater peak value 802 is substantially representative of the plus peak value 804+ or the minus peak value 804− responsive to which peak value has a higher level. The first comparator circuit 806-1 provides a relative size signal 810 based on the threshold value 814 and a signal obtained from the output terminal of the at least one peak detector 136. More specifically, the first comparator circuit 806-1 generates the relative size signal 810 based on a comparison of the threshold value 814 and the greater peak value 802 from the second comparator circuit 806-2. The relative size signal 810 is indicative of whether the greater peak value 802 is larger (or smaller) than the threshold value 814.

The feedback logic 812 generates the control signal 508 based on the relative size signal 810. The feedback control loop 134 (e.g., of FIG. 5) provides the control signal 508 to the at least one control node 516, which functions as an element-level control node in this architecture. The control signal 508 establishes a control voltage 816 at the control node 516. Examples of the control voltage 816 include the first bias voltage Vb1 at the first control node 516-1, the second bias voltage Vb2 at the second control node 516-2, and the supply voltage Vdd at the third control node 516-3. A different control voltage 816, however, may alternatively be employed.

The control voltage 816 at the control node 516 can be established in any of multiple ways. For example, a current mirror can be used to alter an amount of current flowing through a diode-connected transistor to thereby adjust a voltage drop across the transistor. If the control voltage 816 is implemented as the supply voltage Vdd, each element-level component chain 304 may be provided a separate power rail or other supply voltage Vdd to enable substantially independent control of each corresponding power amplifier 132 at an element-level using the respective supply voltage Vdd.

Figure 9:
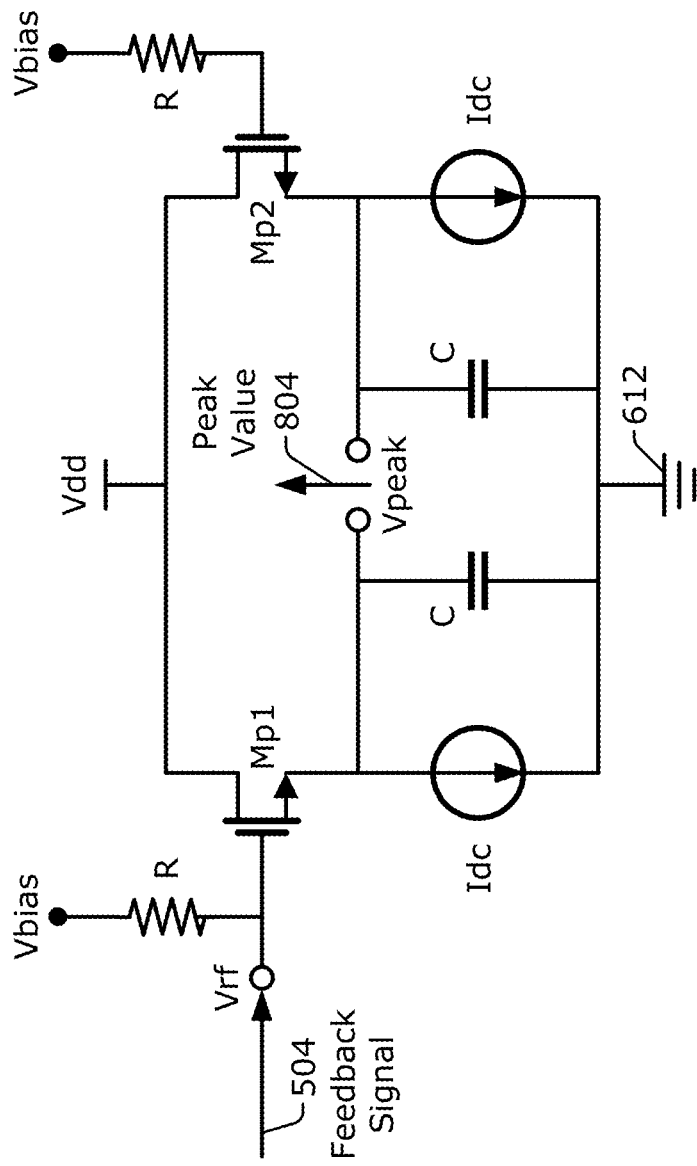
FIG. 9 is a circuit diagram illustrating an example peak detector.

FIG. 9 is a circuit diagram 900 illustrating an example peak detector. Generally, a peak detector 136 (e.g., of FIGS. 1, 5, 7, and 8) can be realized using any of many different circuits. For example, a peak detector can be implemented with a diode and a capacitor. A specific example of a peak detector, however, is depicted as circuit diagram 900. In example implementations, the circuit diagram 900 includes two resistors R, two capacitors C, two direct-current (DC) current sources Idc, and two transistors Mp1 and Mp2. Each transistor Mp is coupled in series with a DC current source Idc between the supply voltage Vdd and the ground node 612. Each capacitor C is coupled in parallel with a DC current source Idc between a source terminal of a transistor Mp and the ground node 612. Each resistor R is coupled between a bias voltage Vbias and a gate terminal of a transistor Mp.

In example operations, an input signal for the peak detector is accepted as a reference voltage Vrf at the gate terminal of the transistor Mp1. An output signal of the peak detector is provided as a peak voltage Vpeak between the two source terminals of the two transistors Mp1 and Mp2. With reference also to FIGS. 5, 7, and 8, the feedback signal 504 is applied as the reference voltage Vrf, and the peak value 804 is generated as the peak voltage Vpeak. The interaction between the transistor Mp1 and the associated DC current source Idc enables the feedback signal 504 to be converted from RF to DC via rectification. The capacitor C provides a memory element to retain a history of voltage levels. Accordingly, the peak voltage Vpeak is produced at the output terminals to generate the peak value 804.

Figure 10:
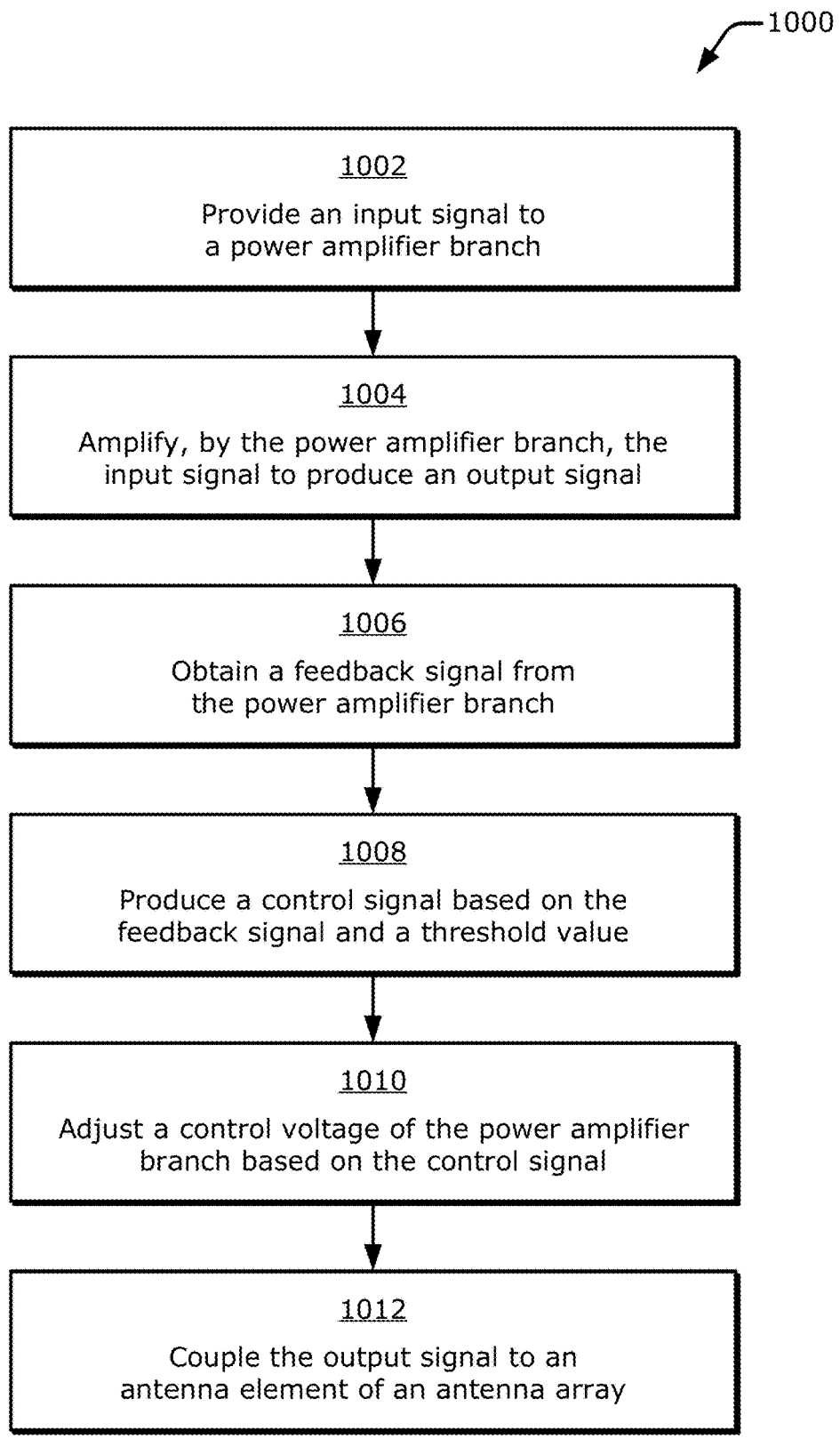
FIG. 10 is a flow diagram illustrating an example process for controlling a power amplifier that is coupled to an antenna array.

FIG. 10 is a flow diagram illustrating an example process 1000 for controlling a power amplifier that is coupled to an antenna element of an antenna array. The process 1000 is described in the form of a set of blocks 1002-1012 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000, or an alternative process. Operations represented by the illustrated blocks of the process 1000 may be performed by a wireless interface device 120 or a portion thereof in conjunction with an antenna element 302 of an antenna array 122. More specifically, at least part of the operations of the process 1000 may be performed by a power amplification system 130 of an RF front-end 128 of the wireless interface device 120.

At block 1002, an input signal is provided to a power amplifier branch. For example, the RF front-end 128 can provide an input signal 518 to a power amplifier branch 502 of a power amplifier 132 of the power amplification system 130. In a differential environment, a first transformer T1 may couple the input signal 518 to respective gate terminals of a first plus transistor M1+ of a plus power amplifier branch 502+ and a first minus transistor M1− of a minus power amplifier branch 502−.

At block 1004, the input signal is amplified, by the power amplifier branch, to produce an output signal. For example, the power amplifier branch 502 can amplify the input signal 518 to produce an output signal 520. This amplification may be performed by a cascode amplifier that includes the first plus transistor M1+ coupled to a second plus transistor M2+ of the plus power amplifier branch 502+ and the first minus transistor M1− coupled to a second minus transistor M2− of the minus power amplifier branch 502−.

At block 1006, a feedback signal is obtained from the power amplifier branch. For example, an element-level feedback control loop 134 of the power amplification system 130 can obtain a feedback signal 504 from the power amplifier branch 502. For instance, a plus peak detector 136+ may sense a plus feedback signal 504+ that reflects a voltage level at a drain terminal of the second plus transistor M2+, and a minus peak detector 136− may sense a minus feedback signal 504− that reflects a voltage level at a drain terminal of the second minus transistor M2−. Thus, the element-level feedback control loop 134 can obtain the feedback signal 504 by sensing a voltage level corresponding to at least one drain terminal of a transistor of the power amplifier branch 502.

At block 1008, a control signal is produced based on the feedback signal and a threshold value. For example, a power amplifier controller 506 of the element-level feedback control loop 134 can produce a control signal 508 based on the feedback signal 504 and a threshold value 814. In some cases, feedback logic 812 may produce the control signal 508 based on whether the voltage level at the drain terminal of the second transistor M2 exceeds a safe voltage level for the second transistor M2, with the safe voltage level represented by the threshold value 814. Thus, the production of the control signal 508 may be implemented by comparing a peak value of the drain voltage level to the threshold value 814 and establishing the control signal 508 to maintain the peak value below the threshold value 814.

At block 1010, a control voltage of the power amplifier branch is adjusted based on the control signal. For example, the power amplifier controller 506 can adjust a control voltage 816 of the power amplifier branch 502 based on the control signal 508. To do so, the control signal 508 may decrease a bias voltage Vb or a supply voltage Vdd that is coupled to a control node 516, which respectively provides a DC bias or a DC supply to at least one transistor of the power amplifier branch 502. After the sensed voltage level has returned to a lower, safe level for some time period, the power amplifier controller 506 can increase the control voltage 816 to a nominal or default voltage level.

At block 1012, the output signal is coupled to an antenna element of the antenna array. For example, the RF front-end 128 can couple the output signal 520 to the antenna element 302 of the antenna array 122. Here, the respective power amplifier 132 of a respective element-level component chain 304 may provide the output signal 520 to the respective antenna element 302 via a coupling element, such as a second transformer T2.

The terms "first," "second," "third," and other numeric-related indicators are used herein to identify or distinguish similar or analogous items from one another within a given context—such as a particular implementation, a single drawing figure, or a claim. Thus, a first item in one context may differ from a first item in another context. For example, an item identified as a "first element-level component chain" in one context may be identified as a "second element-level component chain" in another context.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   an antenna element of an antenna array; and
   a power amplification system comprising:
      at least one input node;
      at least one output node coupled to the antenna element;
      at least one power amplifier branch coupled between the at least one input node and the at least one output node;
      at least one supply voltage node coupled to the at least one power amplifier branch;
      at least one feedback node coupled to the at least one output node;
      at least one control node coupled to at least one bias voltage node of the at least one power amplifier branch; and
      a feedback control loop coupled between the at least one feedback node and the at least one control node.

2. The apparatus of claim 1, wherein the feedback control loop comprises at least one peak detector.

3. The apparatus of claim 2, wherein the at least one peak detector is configured to determine at least one approximately maximum amplitude of a signal at the at least one output node of the power amplification system.

4. The apparatus of claim 1, wherein:
   the at least one power amplifier branch comprises at least one transistor, the at least one transistor comprising at least one gate terminal and at least one drain terminal;
   the at least one drain terminal is coupled to the at least one output node and the at least one feedback node; and
   the at least one gate terminal is coupled to the at least one input node.

5. The apparatus of claim 4, wherein the at least one gate terminal is further coupled to the at least one control node.

6. The apparatus of claim 5, wherein the at least one gate terminal is coupled to the at least one control node via at least part of an inductor.

7. The apparatus of claim 4, wherein:
   the at least one transistor comprises a first transistor and a second transistor;
   each of the first transistor and the second transistor comprises a source terminal, a drain terminal, and a gate terminal;
   the drain terminal of the second transistor is coupled to the at least one output node and the at least one feedback node;
   the source terminal of the second transistor is coupled to the drain terminal of the first transistor;
   the source terminal of the first transistor is coupled to a ground node; and
   the gate terminal of the first transistor is coupled to the at least one input node.

8. The apparatus of claim 7, wherein the at least one control node is coupled to at least one of the gate terminal of the first transistor or the gate terminal of the second transistor.

9. The apparatus of claim 7, wherein the feedback control loop is configured to control a bias voltage of the at least one bias voltage node that is coupled to at least one of the gate terminal of the first transistor or the gate terminal of the second transistor based on a voltage at the drain terminal of the second transistor.

10. The apparatus of claim 1, wherein:
the at least one power amplifier branch comprises a plus power amplifier branch and a minus power amplifier branch;
the at least one input node comprises a plus input node and a minus input node;
the at least one output node comprises a plus output node and a minus output node;
the plus power amplifier branch is coupled between the plus input node and the plus output node; and
the minus power amplifier branch is coupled between the minus input node and the minus output node.

11. The apparatus of claim 10, further comprising:
a first transformer coupled to the plus input node and the minus input node; and
a second transformer coupled between:
the antenna element of the antenna array; and
the plus output node and the minus output node.

12. The apparatus of claim 1, wherein the feedback control loop comprises at least one peak detector having an input terminal, the input terminal coupled to the at least one feedback node.

13. The apparatus of claim 12, wherein the feedback control loop comprises:
a comparator circuit comprising a first input terminal and a second input terminal, the first input terminal coupled to a node configured to provide a threshold value, the second input terminal coupled to an output terminal of the at least one peak detector.

14. The apparatus of claim 13, wherein:
the comparator circuit is configured to provide a relative size signal based on the threshold value and a signal obtained from the output terminal of the at least one peak detector;
the feedback control loop comprises feedback logic configured to generate a control signal based on the relative size signal; and
the feedback control loop is configured to provide the control signal to the at least one control node.

15. The apparatus of claim 14, wherein the control signal is configured to establish a bias voltage for the at least one power amplifier branch.

16. The apparatus of claim 13, wherein:
the at least one feedback node comprises a plus feedback node and a minus feedback node;
the at least one peak detector comprises a plus peak detector and a minus peak detector, each of the plus peak detector and the minus peak detector comprises an input terminal and an output terminal;
the comparator circuit comprises a first comparator circuit;
the feedback control loop comprises a second comparator circuit comprising a first input terminal and a second input terminal;
the input terminal of the plus peak detector is coupled to the plus feedback node;
the input terminal of the minus peak detector is coupled to the minus feedback node;
the first input terminal of the second comparator circuit is coupled to the output terminal of the plus peak detector;
the second input terminal of the second comparator circuit is coupled to the output terminal of the minus peak detector; and
the second input terminal of the first comparator circuit is coupled to the output terminal of the second comparator circuit.

17. The apparatus of claim 16, wherein the second comparator circuit is configured to generate a greater peak value based on a plus peak value from the plus peak detector and a minus peak value from the minus peak detector, the greater peak value substantially representative of the plus peak value or the minus peak value responsive to which peak value has a higher level.

18. The apparatus of claim 1, wherein:
the antenna element of the antenna array comprises a first antenna element;
the power amplification system comprises a first power amplification system;
the at least one power amplifier branch of the first power amplification system comprises at least one first power amplifier branch;
the feedback control loop of the first power amplification system comprises a first feedback control loop; and
the apparatus further comprises:
a second antenna element of the antenna array; and
a second power amplification system coupled to the second antenna element, the second power amplification system comprising at least one second power amplifier branch and a second feedback control loop, the second feedback control loop coupled to the at least one second power amplifier branch.

19. The apparatus of claim 18, wherein:
the first feedback control loop is configured to establish a control voltage of the first power amplifier branch;
the second feedback control loop is configured to establish a control voltage of the second power amplifier branch; and
the first feedback control loop and the second feedback control loop are configured to operate substantially independently.

20. The apparatus of claim 18, wherein:
the first feedback control loop comprises a first element-level feedback control loop;
the second feedback control loop comprises a second element-level feedback control loop; and
the apparatus further comprises:
an array-level component coupled to the first power amplification system and the second power amplification system; and
an array-level controller coupled to the first antenna element, the second antenna element, and the array-level component, the array-level controller configured to adjust the array-level component based on a signal corresponding to the first antenna element and an other signal corresponding to the second antenna element.

21. The apparatus of claim 1, further comprising:
the antenna array comprising multiple antenna elements, the multiple antenna elements comprising the antenna element coupled to the at least one output node; and
a wireless interface device coupled to the antenna array, the wireless interface device comprising the power amplification system and configured to transmit wireless signals via the antenna array using the power amplification system.

22. An apparatus for power amplifier control, the apparatus comprising:
an antenna element of an antenna array; and
a power amplification system comprising:
at least one input node;
at least one output node coupled to the antenna element;

amplification means for amplifying a signal propagating between the at least one input node and the at least one output node;
at least one supply voltage node coupled to the amplification means;
at least one feedback node;
at least one control node configured to provide a bias voltage to the amplification means; and
feedback means for controlling a voltage level present at the at least one feedback node using the at least one control node.

23. The apparatus of claim 22, wherein the feedback means comprises detection means for detecting a peak value of the voltage level present at the at least one feedback node.

24. The apparatus of claim 23, wherein the feedback means comprises:
comparison means for comparing the peak value to a threshold value to generate a relative size signal; and
logic means for establishing the bias voltage of the at least one control node based on the relative size signal.

25. The apparatus of claim 22, wherein:
the antenna element comprises a first antenna element;
the power amplification system comprises a first power amplification system; and
the apparatus further comprises:
a second antenna element of the antenna array;
a second power amplification system coupled to the second antenna element;
an array-level component; and
array-level feedback means for controlling operation of the array-level component based on a value corresponding to the first antenna element and an other value corresponding to the second antenna element.

26. A method for controlling a power amplifier that is coupled to an antenna array, the method comprising:
providing an input signal to a power amplifier branch;
amplifying, by the power amplifier branch, the input signal to produce an output signal;
obtaining a feedback signal from the power amplifier branch;
producing a control signal based on the feedback signal and a threshold value;
adjusting a bias voltage of the power amplifier branch based on the control signal; and
coupling the output signal to an antenna element of the antenna array.

27. The method of claim 26, wherein the obtaining comprises sensing, as the feedback signal, a voltage level corresponding to a drain terminal of a transistor of the power amplifier branch.

28. The method of claim 27, wherein the producing comprises:
detecting a peak value of the voltage level corresponding to the drain terminal of the transistor;
comparing the peak value to the threshold value; and
establishing, based on the comparing, the control signal to maintain the peak value below the threshold value.

29. The method of claim 26, further comprising:
adjusting a supply voltage of the power amplifier branch based on the control signal.

30. An apparatus for power amplifier control, the apparatus comprising:
a first bias voltage node;
a second bias voltage node;
a plus input node and a minus input node;
a plus output node and a minus output node;
a first plus transistor comprising a source terminal, a drain terminal, and a gate terminal, the source terminal coupled to a ground node, the gate terminal coupled to the plus input node and the first bias voltage node;
a first minus transistor comprising a source terminal, a drain terminal, and a gate terminal, the source terminal coupled to the ground node, the gate terminal coupled to the minus input node and the first bias voltage node;
a second plus transistor comprising a source terminal, a drain terminal, and a gate terminal; the source terminal coupled to the drain terminal of the first plus transistor, the drain terminal coupled to the plus output node, and the gate terminal coupled to the second bias voltage node;
a second minus transistor comprising a source terminal, a drain terminal, and a gate terminal; the source terminal coupled to the drain terminal of the first minus transistor, the drain terminal coupled to the minus output node, and the gate terminal coupled to the second bias voltage node; and
a power amplifier controller coupled to at least one of the first bias voltage node or the second bias voltage node, the power amplifier controller comprising:
a plus peak detector coupled to the drain terminal of the second plus transistor, the plus peak detector configured to detect a plus peak value; and
a minus peak detector coupled to the drain terminal of the second minus transistor, the minus peak detector configured to detect a minus peak value,
the power amplifier controller configured to adjust a control voltage applied to at least one of the first bias voltage node or the second bias voltage node based on the plus peak value and the minus peak value.

* * * * *